United States Patent
Ide et al.

(10) Patent No.: US 8,754,642 B2
(45) Date of Patent: Jun. 17, 2014

(54) MAGNETIC BALANCE TYPE CURRENT SENSOR

(75) Inventors: Yosuke Ide, Niigata-ken (JP); Masahiro Iizuka, Niigata-ken (JP); Masamichi Saito, Niigata-ken (JP); Akira Takahashi, Niigata-ken (JP); Hideharu Matsuo, Niigata-ken (JP); Tsuyoshi Nojima, Niigata-ken (JP); Shigenobu Miyajima, Niigata-ken (JP); Naoki Sakatsume, Niigata-ken (JP); Kenji Ichinohe, Niigata-ken (JP); Yoshihiro Nishiyama, Niigata-ken (JP); Tatsuya Kogure, Niigata-ken (JP); Hidekazu Kobayashi, Niigata-ken (JP)

(73) Assignee: Alps Green Devices., Ltd., Tokyo (JP)

( * ) Notice: Subject to any disclaimer, the term of this patent is extended or adjusted under 35 U.S.C. 154(b) by 149 days.

(21) Appl. No.: 13/300,064

(22) Filed: Nov. 18, 2011

(65) Prior Publication Data
US 2012/0062224 A1    Mar. 15, 2012

Related U.S. Application Data

(63) Continuation of application No. PCT/JP2010/059959, filed on Jun. 11, 2010.

(30) Foreign Application Priority Data

Jun. 12, 2009    (JP) ................. 2009-141706

(51) Int. Cl.
    *G01R 33/09*    (2006.01)
(52) U.S. Cl.
    USPC ......................................... 324/252
(58) Field of Classification Search
    USPC ......................................... 324/252
    See application file for complete search history.

(56) References Cited

U.S. PATENT DOCUMENTS

| 5,561,368 A | 10/1996 | Dovek et al. |
| 6,970,332 B2 | 11/2005 | Tetsukawa et al. |

(Continued)

FOREIGN PATENT DOCUMENTS

| JP | 7-318591 | 12/1995 |
| JP | 8-15322 | 1/1996 |

(Continued)

OTHER PUBLICATIONS

Search Report dated Aug. 17, 2010 from International Application No. PCT/JP2010/059959.

(Continued)

*Primary Examiner* — Bot Ledynh
(74) *Attorney, Agent, or Firm* — Beyer Law Group LLP

(57) ABSTRACT

A magnetic balance type current sensor includes a magnetoresistance effect element whose resistance value changes owing to the application of an induction magnetic field from a current to be measured; a feedback coil disposed in the vicinity of the magnetoresistance effect element and generating a cancelling magnetic field cancelling out the induction magnetic field; a magnetic field detection bridge circuit including two outputs causing a voltage difference corresponding to the induction magnetic field to occur; and a magnetic shield attenuating the induction magnetic field and enhancing the cancelling magnetic field, wherein, on the basis of the current flowing through the feedback coil at the time of an equilibrium state in which the induction magnetic field and the cancelling magnetic field are cancelled out, the current to be measured is measured, wherein the feedback coil, the magnetic shield, and the magnetic field detection bridge circuit are formed on a same substrate.

16 Claims, 17 Drawing Sheets

(56) References Cited

U.S. PATENT DOCUMENTS

| | | |
|---|---|---|
| 7,336,070 B2 | 2/2008 | Sasaki et al. |
| 7,554,775 B2 | 6/2009 | Li et al. |
| 7,639,005 B2 | 12/2009 | Qian et al. |
| 8,269,492 B2 * | 9/2012 | Saito et al. ............ 324/252 |
| 8,519,704 B2 | 8/2013 | Ide et al. |
| 2004/0223266 A1 | 11/2004 | Li |
| 2005/0237676 A1 | 10/2005 | Gill |
| 2006/0002038 A1 | 1/2006 | Gill |
| 2006/0012927 A1 | 1/2006 | Seino et al. |
| 2006/0077598 A1 | 4/2006 | Taylor et al. |
| 2007/0007646 A1 | 1/2007 | Yamaguchi et al. |
| 2007/0091509 A1 | 4/2007 | Yi et al. |
| 2007/0297220 A1 | 12/2007 | Yoshikawa et al. |
| 2008/0054897 A1 | 3/2008 | Crolly et al. |
| 2008/0070063 A1 | 3/2008 | Ibusuki et al. |
| 2008/0180863 A1 | 7/2008 | Gill |
| 2008/0274270 A1 | 11/2008 | Wakui et al. |
| 2009/0027813 A1 | 1/2009 | Carey et al. |
| 2010/0141251 A1 | 6/2010 | Ando et al. |
| 2011/0043201 A1 | 2/2011 | Zhou |
| 2011/0121826 A1 | 5/2011 | Engel et al. |
| 2012/0306491 A1 * | 12/2012 | Ide et al. ............ 324/252 |
| 2012/0326715 A1 * | 12/2012 | Ide et al. ............ 324/252 |

FOREIGN PATENT DOCUMENTS

| | | |
|---|---|---|
| JP | 8-179023 | 7/1996 |
| JP | 2000-516714 | 12/2000 |
| JP | 2004-132790 | 4/2004 |
| JP | 2006-125962 | 5/2006 |
| JP | 2007-147460 | 6/2007 |
| JP | 2007-248054 | 9/2007 |
| JP | 2007-263654 | 10/2007 |
| JP | 2008-516255 | 5/2008 |
| JP | 2008-151528 | 7/2008 |
| JP | 2008-275321 | 11/2008 |
| JP | 2008-275566 | 11/2008 |
| JP | 2008-286739 | 11/2008 |
| JP | 2008-306112 | 12/2008 |
| JP | 2009-180604 | 8/2009 |
| JP | 2010-14686 | 1/2010 |
| WO | WO 98/07165 | 2/1998 |

OTHER PUBLICATIONS

Search Report dated Aug. 17, 2010 from International Application No. PCT/JP2010/059791.

Search Report dated May 24, 2011 from International Application No. PCT/JP2011/054082.

International Search Report dated May 31, 2011 from International Application No. PCT/JP2011/055185.

Notice of Allowance dated Jul. 27, 2012 from U.S. Appl. No. 12/891,550.

U.S. Appl. No. 13/917,525, filed Jun. 13, 2013.

Office Action dated Jul. 24, 2013 from U.S. Appl. No. 13/917,525.

* cited by examiner

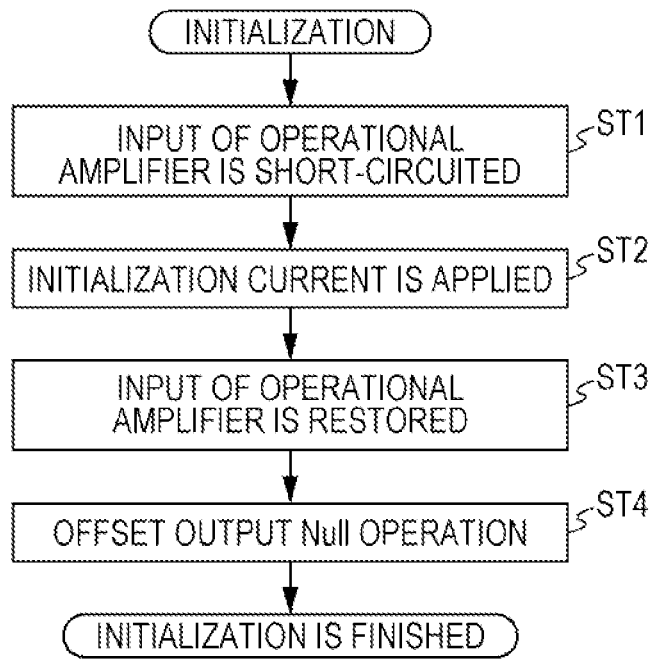
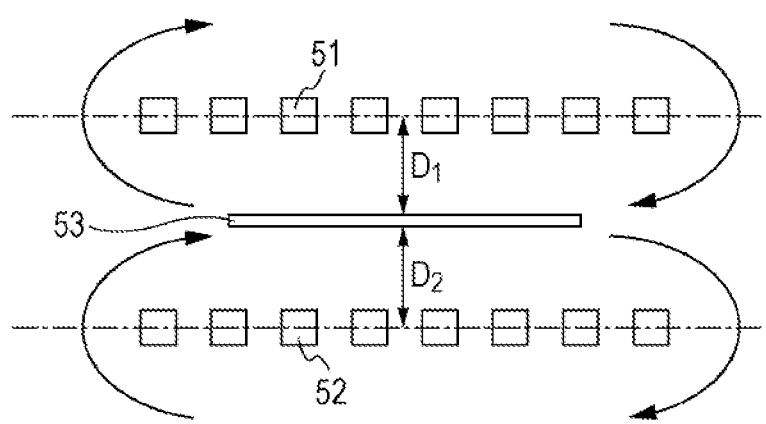

US 8,754,642 B2

MAGNETIC BALANCE TYPE CURRENT SENSOR

CLAIM OF PRIORITY

This application is a Continuation of International Application No. PCT/JP2010/059959 filed on Jun. 11, 2010, which claims benefit of Japanese Patent Application No. 2009-141706, filed on Jun. 12, 2009. The entire contents of each application noted above are hereby incorporated by reference.

BACKGROUND OF THE INVENTION

1. Field of the Invention

The present invention relates to a magnetic balance type current sensor utilizing a magnetoresistance effect element (TMR element or GMR element).

2. Description of the Related Art

In an electric automobile, a motor is driven using electricity generated by an engine, and the intensity of a current used for driving the motor is detected by, for example, a current sensor. The current sensor includes a magnetic core placed around a conductor and having a cutaway portion (core gap) formed at a portion thereof, and a magnetic detecting element placed in the core gap. As such a current sensor, for example, there is a magnetic balance type current sensor as illustrated in FIG. 23. An example of the current sensor is described in Japanese Unexamined Patent Application Publication No. 8-15322.

The magnetic balance type current sensor illustrated in FIG. 23 includes a feedback coil 2 wound around a magnetic core 1 in a direction cancelling a magnetic field B1 generated by a current I to be measured. In the magnetic balance type current sensor, if the current I to be measured flows, an output voltage occurs in a magnetic detecting element 3 owing to the magnetic field B1 according to the current, and a voltage signal output from the magnetic detecting element 3 is converted into a current and fed back to the feedback coil 2. A magnetic field (cancelling magnetic field) B2 occurring owing to the feedback coil 2 and the magnetic field B1 occurring owing to the current I to be measured cancel out each other, and hence an operation is performed so that a magnetic field constantly becomes zero. At this time, the feedback current flowing through the feedback coil is subjected to voltage conversion and extracted as an output. In FIG. 23, a reference symbol 4 indicates an amplifier, and R indicates a detection resistor.

In recent years, electric automobiles have had high power and high performance, and hence current values to be dealt with have become large. Therefore, it is necessary to avoid magnetic saturation at the time of a large current. While it is necessary to enlarge a magnetic core in order to avoid the magnetic saturation, when the magnetic core is enlarged, there occurs a problem that the current sensor itself grows in size. In order to solve the problem of the current sensor utilizing such a magnetic material core, there has been proposed a magnetic balance type current sensor utilizing a magnetoresistance effect element without utilizing a magnetic material core. An example of the magnetic balance type current sensor is described in PCT Japanese Translation Patent Publication No. 2000-516714.

SUMMARY OF THE INVENTION

However, in a magnetic balance type current sensor utilizing a magnetoresistance effect element without utilizing a magnetic material core, when the value of a current to be dealt with becomes large, there occurs a problem that a feedback current becomes large so as to generate a large cancelling magnetic field and hence electric power consumption becomes large. In addition, in the magnetic balance type current sensor utilizing a magnetoresistance effect element without utilizing a magnetic material core, since the magnetic balance type current sensor receives the influence of an external magnetic field, it is necessary to reduce the influence of the external magnetic field.

In view of the above-mentioned problems, the present invention provides a magnetic balance type current sensor capable of achieving electric power saving and reducing the influence of the external magnetic field.

The present invention provides a magnetic balance type current sensor including a magnetoresistance effect element whose resistance value changes owing to the application of an induction magnetic field from a current to be measured; a feedback coil disposed in the vicinity of the magnetoresistance effect element and generating a cancelling magnetic field cancelling out the induction magnetic field; a magnetic field detection bridge circuit including two outputs causing a voltage difference to occur, the voltage difference corresponding to the induction magnetic field; and a magnetic shield attenuating the induction magnetic field and enhancing the cancelling magnetic field, wherein a current is applied to the feedback coil on the basis of the voltage difference and, on the basis of the current flowing through the feedback coil at the time of an equilibrium state in which the induction magnetic field and the cancelling magnetic field are cancelled out, the current to be measured is measured, wherein the feedback coil, the magnetic shield, and the magnetic field detection bridge circuit are formed on a same substrate.

In this configuration, the magnetic shield is included adjacent to the feedback coil. The magnetic shield may attenuate the induction magnetic field occurring from the current to be measured and being applied to the magnetoresistance effect element and enhance the cancelling magnetic field from the feedback coil. Accordingly, since the magnetic shield functions as a magnetic yoke, it may be possible to reduce a current passed through the feedback coil and it may be possible to achieve electric power saving. In addition, owing to the magnetic shield, it may be possible to reduce the influence of the external magnetic field.

In the magnetic balance type current sensor according to preferred embodiments of the present invention, it is desirable that the feedback coil is disposed between the magnetic shield and the magnetic field detection bridge circuit and the magnetic shield is disposed on a side near the current to be measured.

In the magnetic balance type current sensor according to preferred embodiments of the present invention, it is desirable that the magnetoresistance effect element is a spin-valve-type GMR element or a spin-valve-type TMR element.

In the magnetic balance type current sensor according to preferred embodiments of the present invention, it is desirable that the GMR element includes a meander shape whose width is from 1 μm to 10 μm, a length in a longitudinal direction is more than or equal to twice a width, and the GMR element is disposed so that the longitudinal direction is perpendicular to both a direction of the induction magnetic field and a direction of the cancelling magnetic field.

In the magnetic balance type current sensor according to preferred embodiments of the present invention, it is desirable that the TMR element includes a rectangle shape whose width is from 1 μm to 10 μm, a length in a longitudinal direction is more than or equal to twice a width, and the TMR element is disposed so that the longitudinal direction is perpendicular to both a direction of the induction magnetic field and a direction of the cancelling magnetic field.

In the magnetic balance type current sensor according to preferred embodiments of the present invention, it is desirable that the feedback coil is configured using a planar coil and the planar coil is provided so that both the induction magnetic field and the cancelling magnetic field occur in a plane parallel to the forming surface of the planar coil.

In the magnetic balance type current sensor according to preferred embodiments of the present invention, it is desirable that the magnetic shield is configured by high magnetic permeability material selected from among amorphous magnetic material, permalloy-based magnetic material, and iron-based microcrystalline material.

In the magnetic balance type current sensor according to preferred embodiments of the present invention, it is desirable that a distance between the magnetoresistance effect element and the magnetic shield is from 2 μm to 20 μm.

In the magnetic balance type current sensor according to preferred embodiments of the present invention, it is desirable that a film thickness of the magnetic shield is from 2 μm to 20 μm.

In the magnetic balance type current sensor according to preferred embodiments of the present invention, it is desirable that a dimension of the magnetic shield is from 400 μm to 1000 μm.

The present invention provides a magnetic balance type current sensor including a magnetoresistance effect element whose resistance value changes owing to the application of an induction magnetic field from a current to be measured; a feedback coil disposed in the vicinity of the magnetoresistance effect element and generating a cancelling magnetic field cancelling out the induction magnetic field; a magnetic field detection bridge circuit including two outputs causing a voltage difference to occur, the voltage difference corresponding to the induction magnetic field; and a magnetic shield attenuating the induction magnetic field and enhancing the cancelling magnetic field, wherein a current is applied to the feedback coil on the basis of the voltage difference and, on the basis of the current flowing through the feedback coil at the time of an equilibrium state in which the induction magnetic field and the cancelling magnetic field are cancelled out, the current to be measured is measured, wherein the feedback coil, the magnetic shield, and the magnetic field detection bridge circuit are formed on a same substrate. Therefore, it may be possible to achieve electric power saving and it may be possible to reduce the influence of the external magnetic field.

BRIEF DESCRIPTION OF THE DRAWINGS

FIG. 17 is a flow diagram for explaining the initialization process in the second embodiment;

FIG. 18 is a diagram illustrating part of a magnetic balance type current sensor according to a third embodiment;

DESCRIPTION OF THE PREFERRED EMBODIMENTS

Hereinafter, embodiments of the present invention will be described in detail with reference to accompanying drawings.
(First Embodiment)

Figure 1:
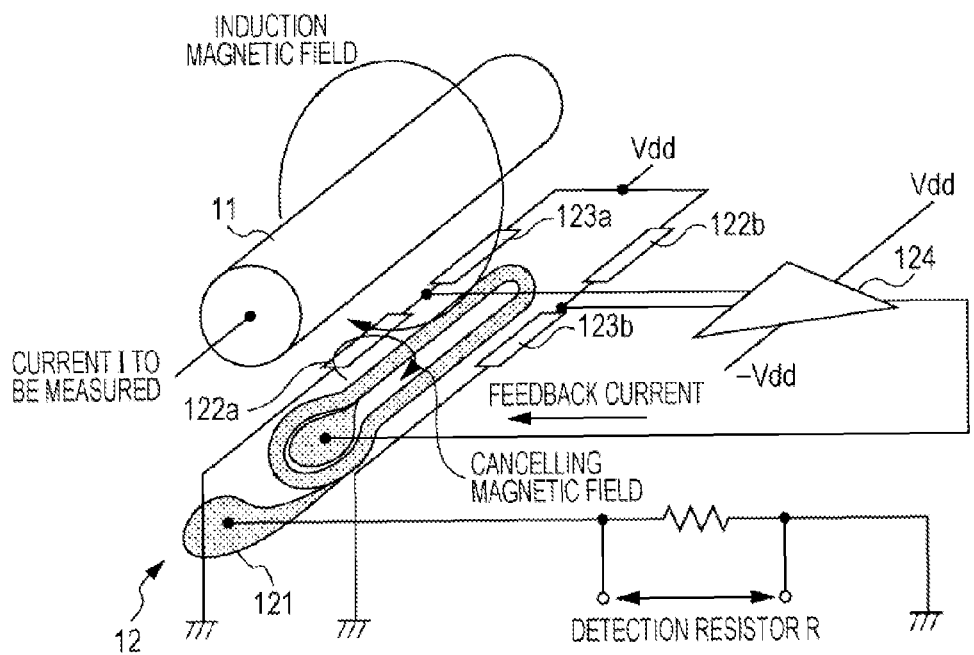
FIG. 1 is a diagram illustrating a magnetic balance type current sensor according to a first embodiment of the present invention.
Figure 2:
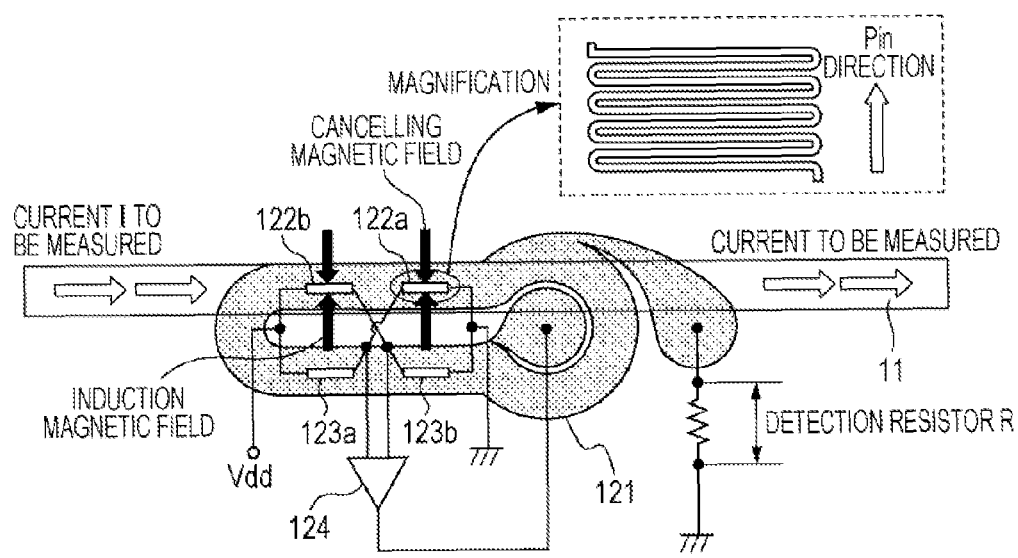
FIG. 2 is a diagram illustrating the magnetic balance type current sensor according to the first embodiment of the present invention.

FIG. 1 and FIG. 2 are diagrams illustrating a magnetic balance type current sensor according to a first embodiment of the present invention. In the present embodiment, the magnetic balance type current sensor illustrated in FIG. 1 and FIG. 2 is arranged in the vicinity of a conductor 11 through which a current I to be measured flows. The magnetic balance type current sensor includes a feedback circuit 12 causing a magnetic field (cancelling magnetic field) to occur, the magnetic field cancelling out an induction magnetic field due to the current I to be measured flowing through the conductor 11. The feedback circuit 12 includes a feedback coil 121 wound in a direction cancelling out the magnetic field occurring owing to the current I to be measured, two magnetoresistance effect elements 122a and 122b that are magnetic detecting elements, and two fixed resistance elements 123a and 123b.

The feedback coil 121 is configured using a planar coil. In this configuration, since no magnetic core is included, it may be possible to manufacture the feedback coil at a low cost. In addition, compared with the case of a toroidal coil, it may be possible to prevent the cancelling magnetic field occurring from the feedback coil from spreading over a wide area and it may be possible to prevent the cancelling magnetic field from influencing a peripheral circuit. Furthermore, compared with the case of the toroidal coil, when the current to be measured is an alternate current, it is easy to control the cancelling magnetic field due to the feedback coil and a current caused to flow for the control does not become so large. These advantageous effects become large when the current to be measured is an alternate current and becomes a high-frequency wave. When the feedback coil 121 is configured using a planar coil, it is preferable that the planar coil is provided so that both the induction magnetic field and the cancelling magnetic field occur in a plane parallel to the forming surface of the planar coil.

The resistance value of a magnetoresistance effect element 122 changes owing to the application of the induction magnetic field from the current I to be measured. The two magnetoresistance effect elements 122a and 122b configure a magnetic field detection bridge circuit along with the two fixed resistance elements 123a and 123b. Using the magnetic field detection bridge circuit including the magnetoresistance effect elements in this way, it may be possible to realize a highly-sensitive magnetic balance type current sensor.

This magnetic field detection bridge circuit includes two outputs causing a voltage difference to occur, the voltage difference corresponding to the induction magnetic field occurring owing to the current I to be measured. In the magnetic field detection bridge circuit illustrated in FIG. 2, a power source Vdd is connected to a connection point between the magnetoresistance effect element 122b and the fixed resistance element 123a, and a ground (GND) is connected to a connection point between the magnetoresistance effect element 122a and the fixed resistance element 123b. Furthermore, in this magnetic field detection bridge circuit, one output is extracted from the connection point between the magnetoresistance effect element 122a and the fixed resistance element 123a, and the other output is extracted from the connection point between the magnetoresistance effect element 122b and the fixed resistance element 123b. These two outputs are amplified by an amplifier 124, and are applied to the feedback coil 121 as a current (feedback current). This feedback current corresponds to the voltage difference according to the induction magnetic field. At this time, in the feedback coil 121, the cancelling magnetic field cancelling out the induction magnetic field occurs. In addition, on the basis of the current flowing through the feedback coil 121 at the time of an equilibrium state in which the induction magnetic field and the cancelling magnetic field are cancelled out, the current to be measured is measured in a detection unit (detection resistor R).

Figure 3:
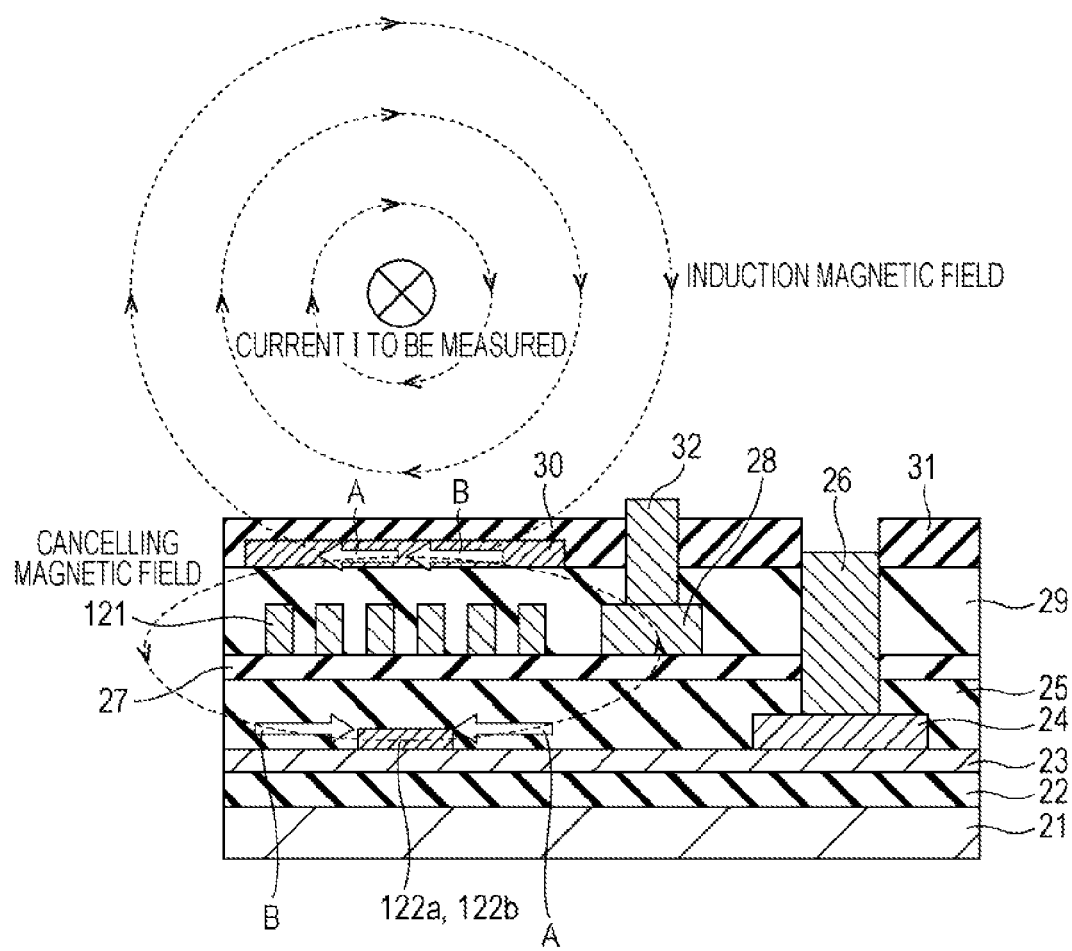
FIG. 3 is a cross-sectional view illustrating the magnetic balance type current sensor illustrated in FIG. 1.

FIG. 3 is a cross-sectional view illustrating the magnetic balance type current sensor illustrated in FIG. 1. As illustrated in FIG. 3, in the magnetic balance type current sensor according to the present embodiment, the feedback coil, a magnetic shield, and the magnetic field detection bridge circuit are formed on a same substrate 21. In the configuration illustrated in FIG. 3, the feedback coil is disposed between the magnetic shield and the magnetic field detection bridge circuit, and the magnetic shield is disposed on a side near the current I to be measured. Namely, from a side near the conductor 11, the magnetic shield, the feedback coil, and the magnetoresistance effect element are disposed in this order. Accordingly, it may be possible to farthest distance the magnetoresistance effect element from the conductor 11, and it may be possible to reduce the induction magnetic field applied from the current I to be measured to the magnetoresistance effect element. In addition, since it may be possible to bring the magnetic shield closest to the conductor 11, it may be possible to further enhance the attenuation effect of the induction magnetic field. Accordingly, it may be possible to reduce the cancelling magnetic field from the feedback coil.

The layer structure illustrated in FIG. 3 will be described in detail. In the magnetic balance type current sensor illustrated in FIG. 3, a thermal silicon oxide film 22 serving as an insulation layer is formed on the substrate 21. On the thermal silicon oxide film 22, an aluminum oxide film 23 is formed. For example, the aluminum oxide film 23 may be formed as a film by a method such as sputtering or the like. In addition, a silicon substrate or the like is used as the substrate 21.

On the aluminum oxide film 23, the magnetoresistance effect elements 122a and 122b are formed. At this time, along with the magnetoresistance effect elements 122a and 122b, the fixed resistance elements 123a and 123b are also provided and the magnetic field detection bridge circuit is formed. As the magnetoresistance effect elements 122a and 122b, a tunnel-type magnetoresistance effect element (TMR element), a giant magnetoresistance effect element (GMR element), or the like may be used. For example, a spin-valve-type GMR element configured by a multilayer film including an antiferromagnetic layer, a fixed magnetic layer, a nonmagnetic layer, and a free magnetic layer, as the GMR element, or a spin-valve-type TMR element may be used.

As the spin-valve-type GMR element, a GMR element having a meander shape illustrated in the magnified view in FIG. 2 is desirable. Considering the linearity in the meander shape, it is desirable that the width D thereof in a pin (Pin) direction is from 1 μm to 10 μm. In this case, considering the linearity, it is desirable that the longitudinal direction is perpendicular to both the direction of the induction magnetic field and the direction of the cancelling magnetic field. With such a meander shape, it may be possible to obtain the output of the magnetoresistance effect element with fewer terminals (two terminals) than Hall elements.

In addition, as the spin-valve-type TMR element, considering the linearity, it is desirable that the spin-valve-type TMR element has a rectangle shape where the width thereof in a pin direction is from 1 μm to 10 μm. In this case, considering the linearity, it is desirable that the longitudinal direction is perpendicular to both the direction of the induction magnetic field and the direction of the cancelling magnetic field.

In addition, on the aluminum oxide film 23, an electrode 24 is formed. The electrode 24 may be formed by photolithography and etching after electrode material has been formed as a film.

On the aluminum oxide film 23 on which the magnetoresistance effect elements 122a and 122b and the electrode 24 are formed, a polyimide layer 25 is formed as an insulation layer. The polyimide layer 25 may be formed by applying and curing polyimide material.

A silicon oxide film 27 is formed on the polyimide layer 25. For example, the silicon oxide film 27 may be formed as a film by a method such as sputtering or the like.

On the silicon oxide film 27, the feedback coil 121 is formed. The feedback coil 121 may be formed by photolithography and etching after coil material has been formed as a film. Alternatively, the feedback coil 121 may be formed by photolithography and plating after base material has been formed as a film.

In addition, on the silicon oxide film 27, a coil electrode 28 is formed in the vicinity of the feedback coil 121. The coil electrode 28 may be formed by photolithography and etching after electrode material has been formed as a film.

On the silicon oxide film 27 on which the feedback coil 121 and the coil electrode 28 are formed, a polyimide layer 29 is formed as an insulation layer. The polyimide layer 29 may be formed by applying and curing polyimide material.

A magnetic shield 30 is formed on the polyimide layer 29. As the configuration material of the magnetic shield 30, high magnetic permeability material such as amorphous magnetic material, permalloy-based magnetic material, iron-based microcrystalline material, or the like may be used.

On the polyimide layer 29, a silicon oxide film 31 is formed. For example, the silicon oxide film 31 may be formed as a film by a method such as sputtering or the like. Contact holes are formed in predetermined regions of the polyimide layer 29 and the silicon oxide film 31 (the region of the coil electrode 28 and the region of the electrode 24), and electrode pads 32 and 26 are individually formed in the contact holes. The contact holes are formed using photolithography, etching, and the like. The electrode pads 32 and 26 may be formed by photolithography and plating after electrode material has been formed as a film.

In the magnetic balance type current sensor including such a configuration as described above, as illustrated in FIG. 3, the magnetoresistance effect element 122 receives an induction magnetic field A occurring from the current I to be measured, and the induction magnetic field is fed back to generate a cancelling magnetic field B from the feedback coil 121 and to appropriately adjust the cancelling magnetic field B in such a way that the two magnetic fields (the induced magnetic field A and the cancelling magnetic field B) are cancelled out and a magnetic field applied to the magnetoresistance effect element 122 becomes zero.

As illustrated in FIG. 3, the magnetic balance type current sensor according to the present invention includes the magnetic shield 30 adjacent to the feedback coil 121. The magnetic shield 30 may attenuate the induction magnetic field occurring from the current I to be measured and being applied to the magnetoresistance effect elements 122a and 122b (in the magnetoresistance effect element, the direction of the induction magnetic field A and the direction of the cancelling magnetic field B are opposite to each other), and the magnetic shield 30 can enhance the cancelling magnetic field B from the feedback coil 121 (in the magnetic shield, the direction of the induction magnetic field A and the direction of the cancelling magnetic field B are equal to each other). Accordingly, since the magnetic shield 30 functions as a magnetic yoke, it may be possible to reduce a current passed through the feedback coil 121 and it may be possible to achieve electric power saving. In addition, according to this magnetic shield 30, it may be possible to reduce the influence of the external magnetic field.

Here, a distance between the magnetoresistance effect elements 122a and 122b and the magnetic shield 30 will be described. An appropriate distance between the magnetoresistance effect elements 122a and 122b and the magnetic shield 30 is restricted by an insulation property between the magnetic shield 30, the magnetoresistance effect elements 122a and 122b, and the feedback coil 121 and the restriction of a thin film process. Accordingly, considering the insulation property and the restriction of a thin film process, it is necessary to arbitrarily set the distance.

A relationship between a distance between the magnetoresistance effect element (GMR) and the magnetic shield and the reduction effect of sensor sensitivity due to a shield was studied. The results are individually illustrated in FIGS. 4A and 4B. In this case, the permalloy film of Ni81Fe19 was used as the magnetic shield, the feedback coil was formed in a polyimide layer serving as an insulation layer, and a distance between the magnetoresistance effect element and the magnetic shield was adjusted by changing the thickness of the polyimide layer. In addition, the shape of the magnetic shield (a circular pattern (PTN1), a rectangular pattern (1000 μm×500 μm) (PTN2), a rectangular pattern (1300 μm×600 μm) (PTN3), a rectangular pattern (1600 μm×800 μm) (PTN4)) was changed, and measurement was performed with respect to each shape.

Figure 4A:
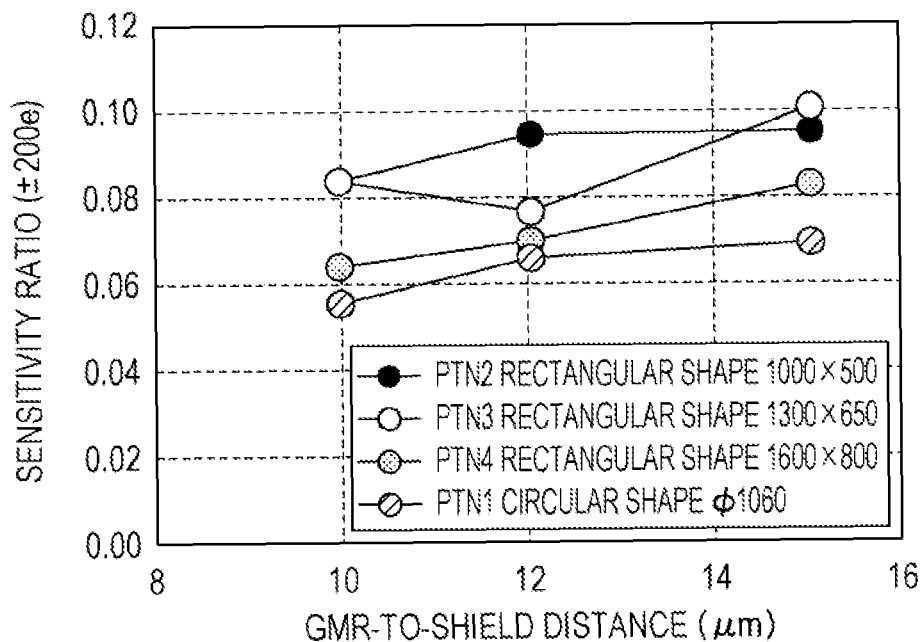
FIG. 4A is a diagram illustrating a relationship between a GMR-to-magnetic shield distance and a sensitivity ratio and FIG. 4B is a diagram illustrating a relationship between the GMR-to-magnetic shield distance and a shielding effect.
Figure 4B:
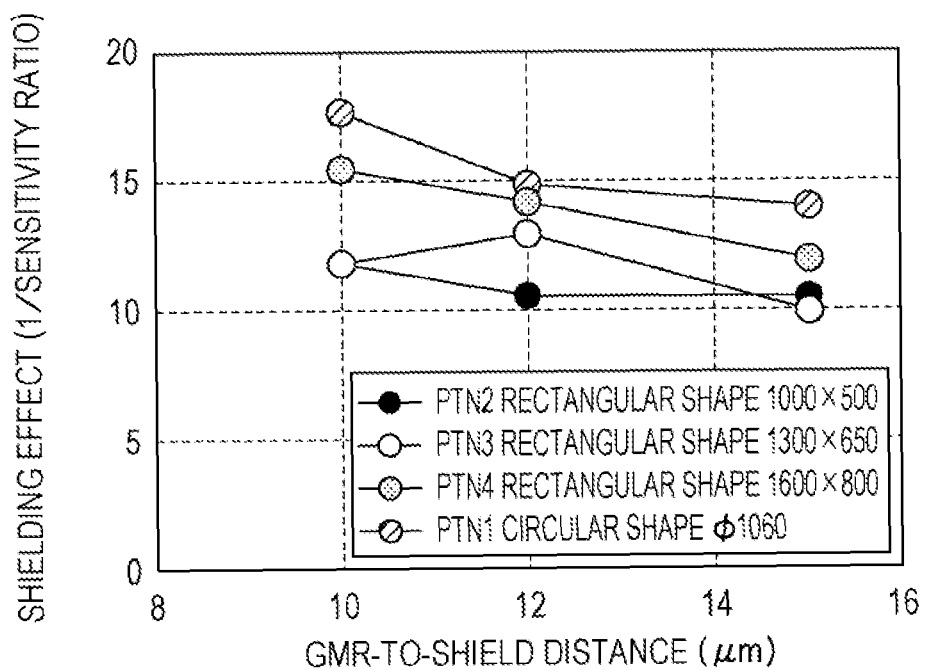

FIG. 4A is a diagram illustrating a relationship between a GMR-to-shield distance and a sensitivity ratio and FIG. 4B is a diagram illustrating a relationship between the GMR-to-shield distance and a shielding effect (1/sensitivity ratio). In addition, the sensitivity ratio is obtained on the basis of a ratio between sensitivity when no magnetic shield exists and sensitivity when a magnetic shield exists, and means a rate at which a magnetic field is reduced by the magnetic shield. As can be seen from FIGS. 4A and 4B, the magnetic field reduction effect tends to decrease with an increase in the GMR-to-shield distance.

Since the polyimide layer doubles as the insulation layers of the magnetoresistance effect element and the feedback coil, considering that insulation property is secured and the feedback coil is formed in the layer, it is desirable that the film thickness of the polyimide layer is at least greater than or equal to 2 μm. In addition, if the thickness of the polyimide layer is too large, it is difficult to form a layer located on top of the magnetic shield, such as a protective layer, a pad portion, or the like, and contact with a terminal portion becomes hard to establish. Therefore, it is desirable that the film thickness upper limit of the polyimide layer is about 20 μm. Accordingly, when a magnetoresistance effect element-to-magnetic shield distance is adjusted by the film thickness of the polyimide layer, it is desirable that a distance between the magnetoresistance effect element and the magnetic shield is from 2 μm to 20 μm.

Next, a distance between the magnetoresistance effect elements 122a and 122b and the magnetic shield 30 will be described. An adequate distance between the magnetoresistance effect elements 122a and 122b and the magnetic shield 30 is restricted by the reduction effect of the magnetic field and the restriction of a thin film process for forming an element. Accordingly, considering the reduction effect of the magnetic field and the restriction of a thin film process, it is necessary to arbitrarily set the distance.

Figure 5A:
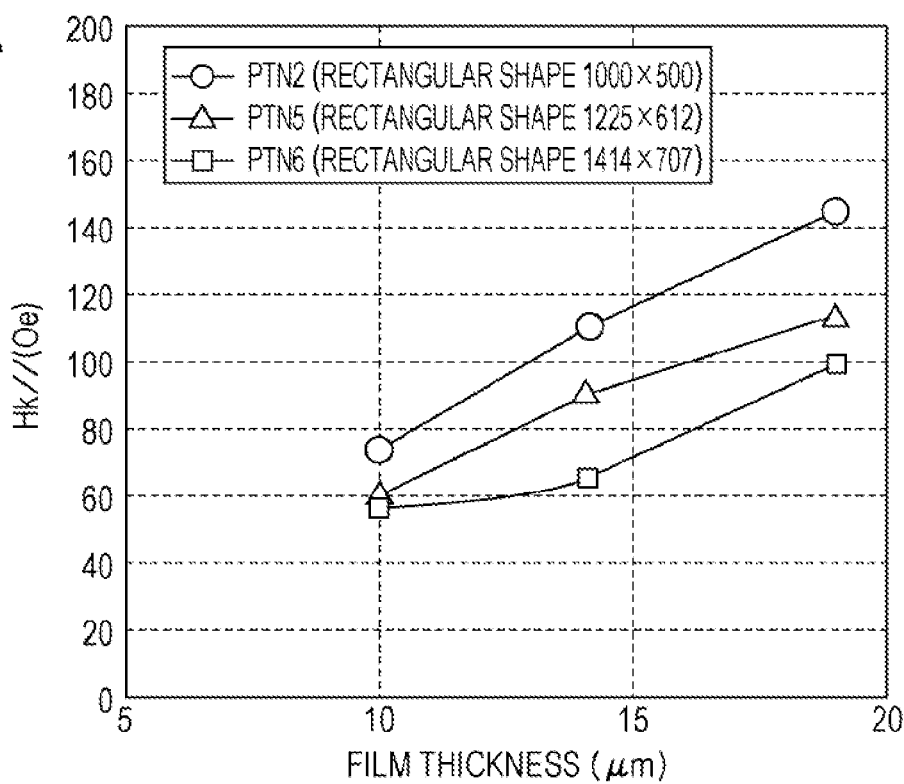
FIGS. 5A and 5B are diagrams illustrating a relationship between a magnetic shield film thickness and an anisotropy field.
Figure 5B:
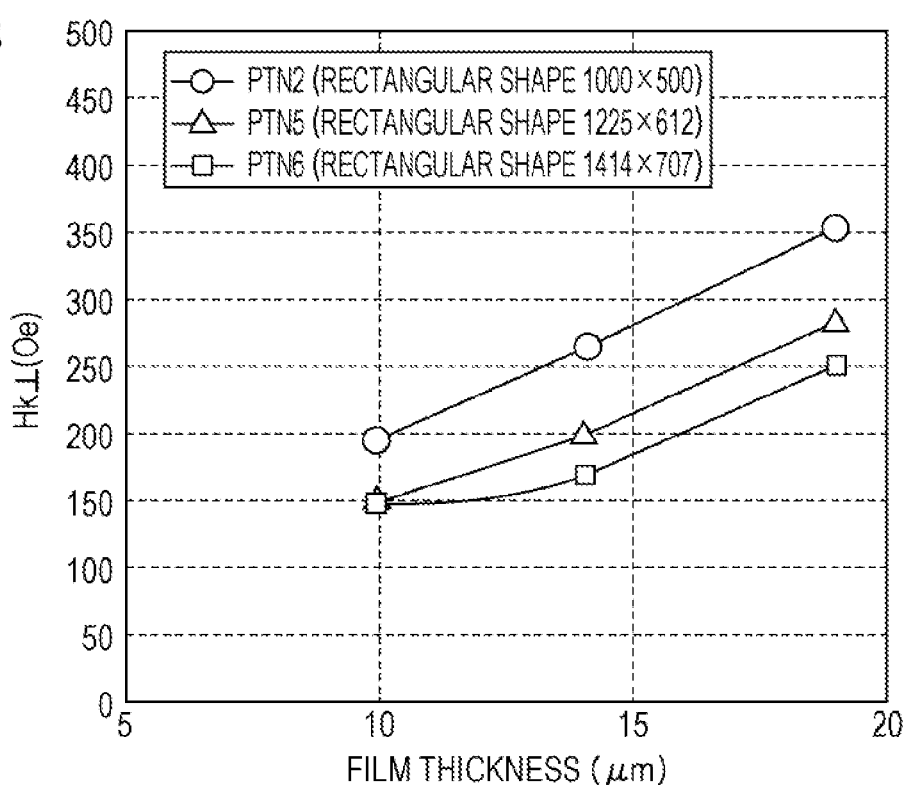

First, a relationship between the film thickness of the magnetic shield and an anisotropy field was studied. The results are individually illustrated in FIGS. 5A and 5B. In this case, the permalloy film of Ni81Fe 19 was used as the magnetic shield. In addition, the shape of the magnetic shield (a rectangular pattern (1000 μm×500 μm) (PTN2), a rectangular pattern (1225 µm×612 µm) (PTN5), a rectangular pattern (1414 µm×707 µm) (PTN6)) was changed, and measurement was performed with respect to each shape. As can be seen from FIGS. 5A and 5B, the anisotropy field (a horizontal direction, a vertical direction) tends to increase with an increase in the film thickness of the magnetic shield.

Figure 6:
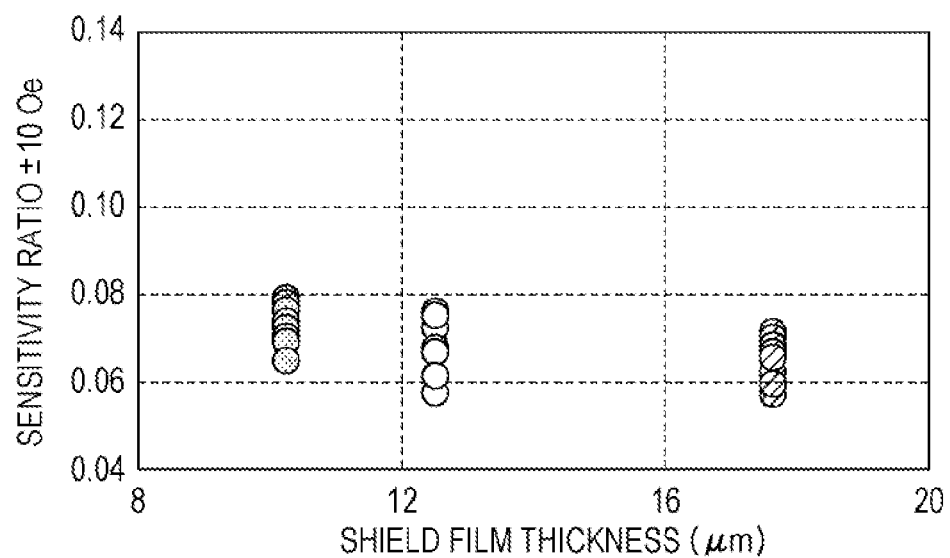
FIG. 6 is a diagram illustrating a relationship between a magnetic shield film thickness and a sensitivity ratio.

In addition, a relationship between the film thickness of the magnetic shield and the sensitivity of the magnetoresistance effect element was studied. The result is illustrated in FIG. 6. In addition, the sensitivity ratio is obtained on the basis of a ratio between sensitivity when no magnetic shield exists and sensitivity when a magnetic shield exists, and means a rate at which a magnetic field is reduced by the magnetic shield. Compared with the case in which no magnetic shield exists, the sensitivity decreases with an increase in the thickness of the magnetic shield, and the magnetic field from the current to be measured applied to the magnetoresistance effect element is reduced. When the magnetic shield film thickness is 10 µm, the proportion of a decrease in the sensitivity is about 0.070. On the other hand, when the magnetic shield film thickness is 10 µm, the proportion of a decrease in the sensitivity is about 0.065.

Figure 7:
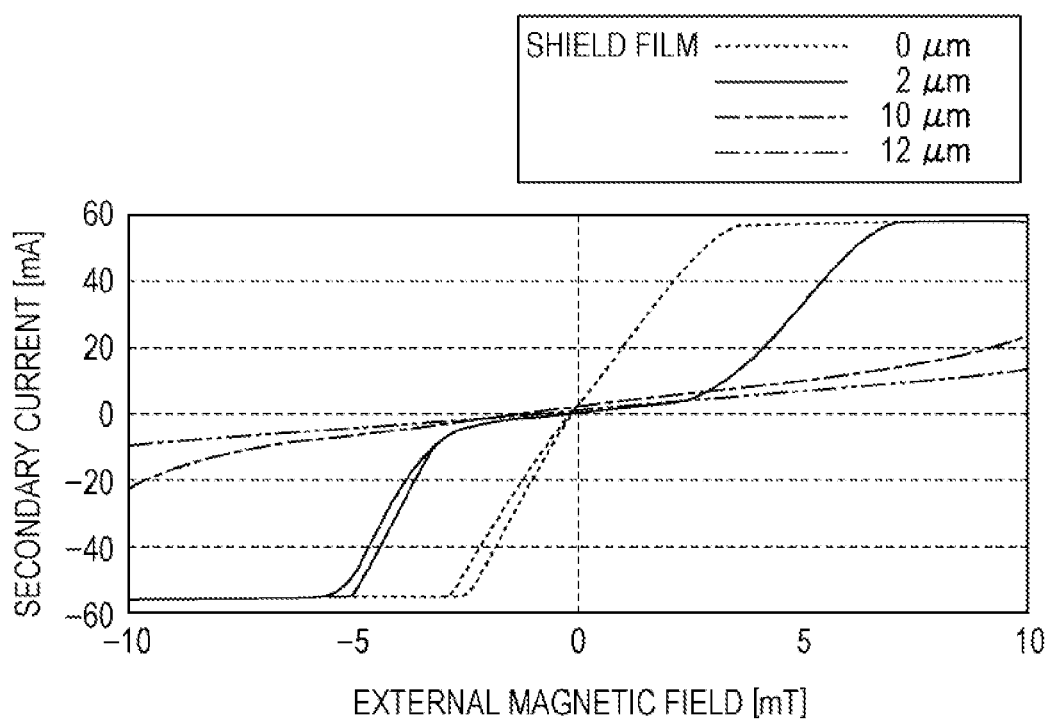
FIG. 7 is a diagram illustrating a relationship between an external magnetic field and a secondary current.

Next, a relationship between the cancelling current when an external magnetic field is applied to the current sensor and the film thickness of the magnetic shield was studied. The result is illustrated in FIG. 7. As illustrated in FIG. 7, when no magnetic shield exists, the external magnetic field is saturated at about 3 mT. In addition, when the film thickness of the magnetic shield is 2 µm, while a slope in the vicinity of a zero magnetic shield is gentle, the slope changes rapidly at about 3 mT, and it indicates that the magnetic shield is saturated and an effect weakening the magnetic shield is attenuated. Accordingly, the magnetic shield whose film thickness is at least greater than or equal to 2 µm is necessary for obtaining an effect attenuating the magnetic field applied to the magnetoresistance effect element. In addition, when the film thickness of the magnetic shield becomes greater than or equal to 20 µm, it is difficult to form a layer located on top of the magnetic shield, such as a protective layer, a pad portion, or the like. Therefore, it is desirable that the film thickness of the magnetic shield is from 2 µm to 20 µm.

Figure 8:
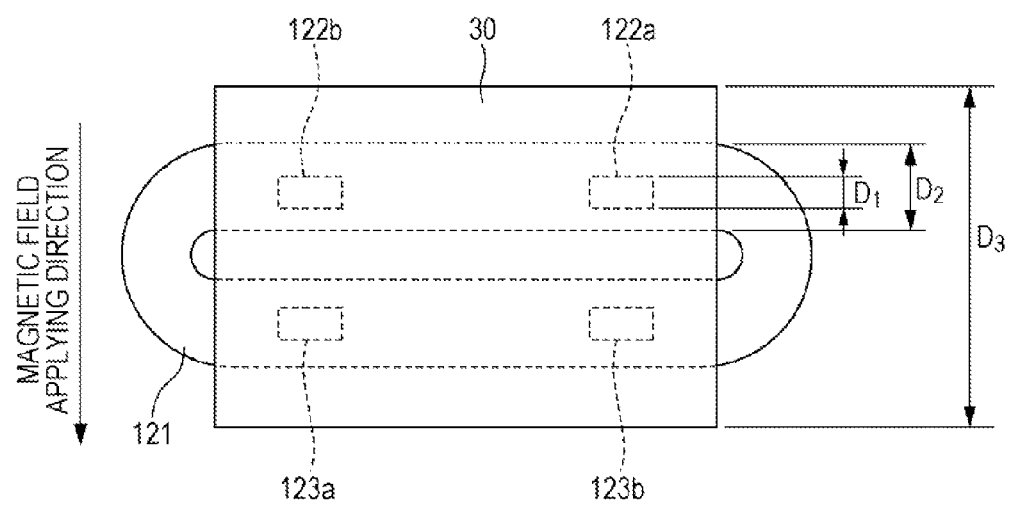
FIG. 8 is a diagram for explaining dimensions between a magnetic shield, a feedback coil, and a magnetoresistance effect element.

Next, the shape of the magnetic shield was studied. As illustrated in FIG. 8, it is only necessary for the magnetic shield 30 to have a size for covering at least the magnetoresistance effect elements 122a and 122b in planar view. In addition, since a length in the magnetic field applying direction is dominant in the magnetic shield 30, it is desirable that the length in the magnetic field applying direction is longer than the width of the feedback coil 121. In addition, it is desirable that, in the magnetic shield 30, the ratio (aspect ratio) of the width direction to the longitudinal direction of the feedback coil 121 (the direction perpendicular to the magnetic field applying direction) is greater than or equal to "1". Furthermore, in order to cause the cancelling magnetic field to be enhanced, it is desirable that a relationship between a magnetoresistance effect element width D1, a feedback coil width D2, and a magnetic shield width D3 in FIG. 8 satisfies D1<D2<D3.

Figure 9A:
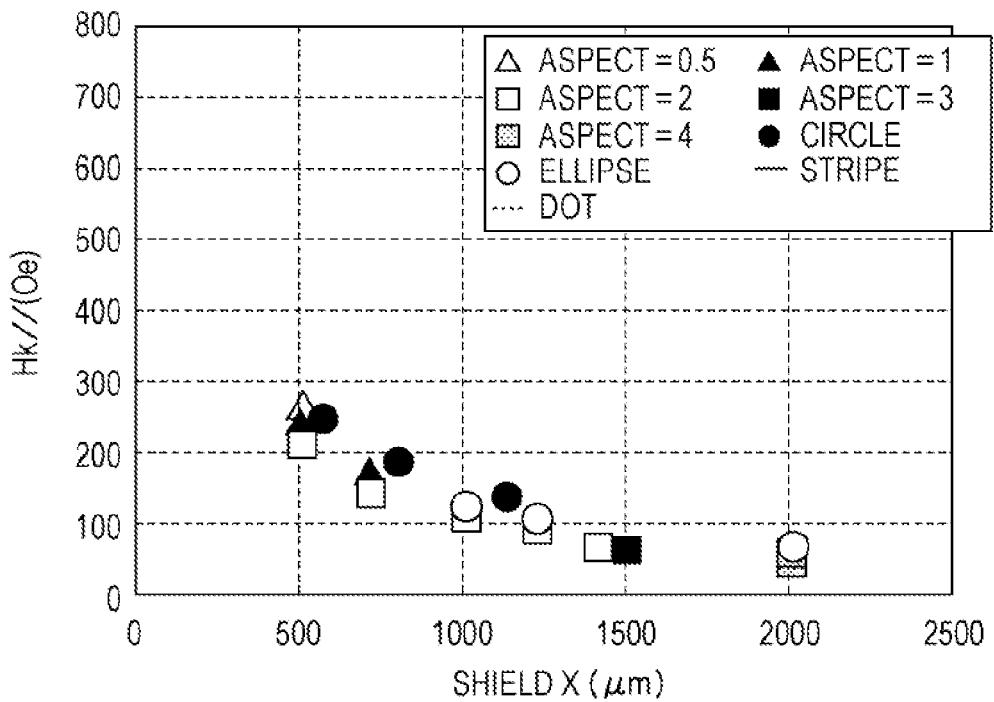
FIGS. 9A and 9B are diagrams illustrating a relationship between a magnetic shield shape and an anisotropy field.
Figure 9B:
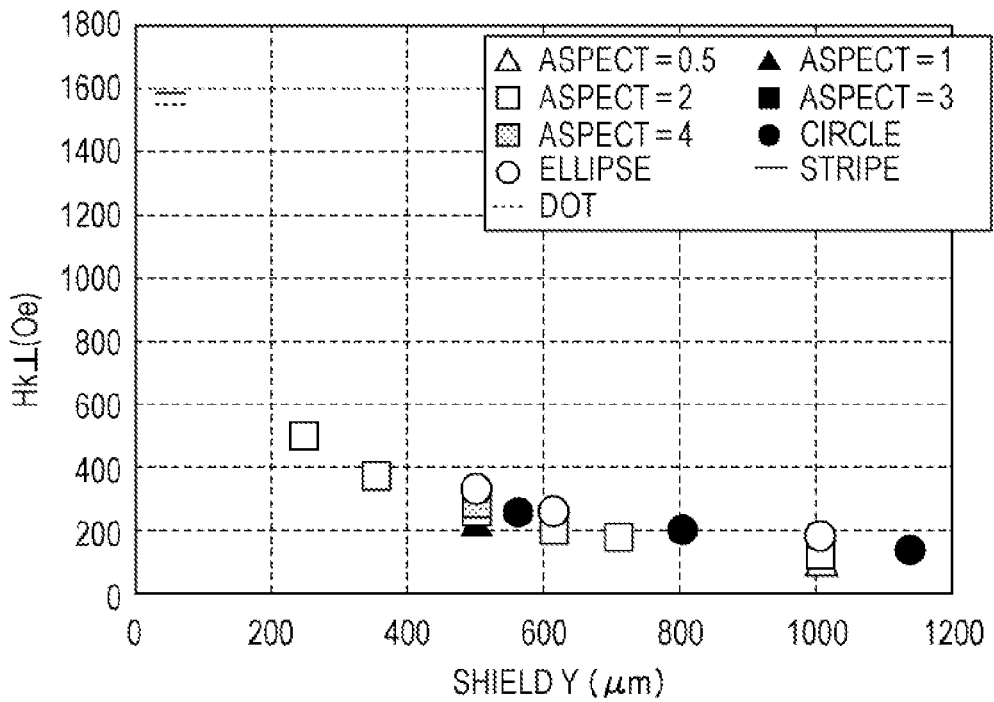

Next, a relationship between the shape of the magnetic shield 30 and the anisotropy field was studied. The results are individually illustrated in FIGS. 9A and 9B. In this case, the shape of the magnetic shield was changed, and measurement was performed with respect to each shape. In FIG. 9A, a shield X corresponds to the length of the magnetic shield in the magnetic field applying direction in FIG. 8, and in FIG. 9B, a shield Y corresponds to the length of the magnetic shield in the direction perpendicular to the magnetic field applying direction in FIG. 8. In addition, in this case, as the magnetic shield, a permalloy film of Ni81Fe 19 was used. A range in which the linearity of the current sensor is good is almost obtained within a range in which the magnetic shield is unsaturated, and it may be possible to improve the linearity by changing the shield shape. For example, as illustrated in FIGS. 9A and 9B, a shield dimension causing the anisotropy field greater than or equal to 1000 e to be obtained is about less than or equal to 1000 µm. In addition, when the shield dimension becomes less than or equal to 400 µm and the anisotropy field becomes greater than or equal to 3000 e, the effect of the magnetic shield is reduced. Considering these tendencies, it is desirable that the dimension of the magnetic shield is from 400 µm to 1000 µm.

Figure 10A:
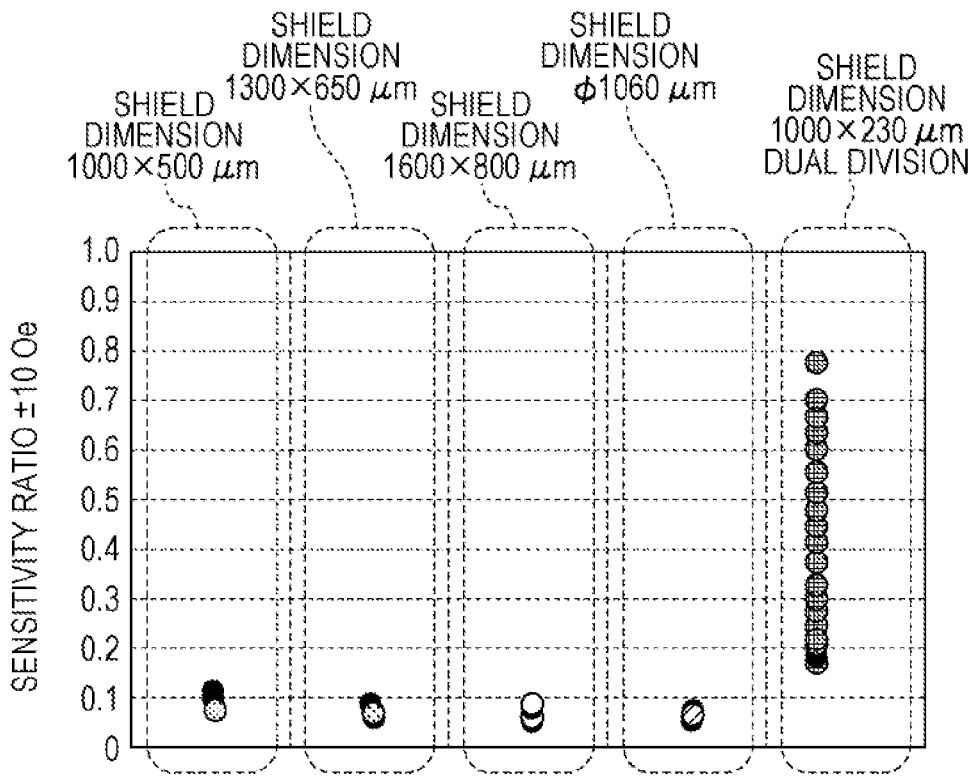
FIG. 10A is a diagram illustrating a relationship between a magnetic shield shape and sensitivity and FIG. 10B is a diagram illustrating a relationship between a magnetic shield shape and a sensitivity ratio.
Figure 10B:
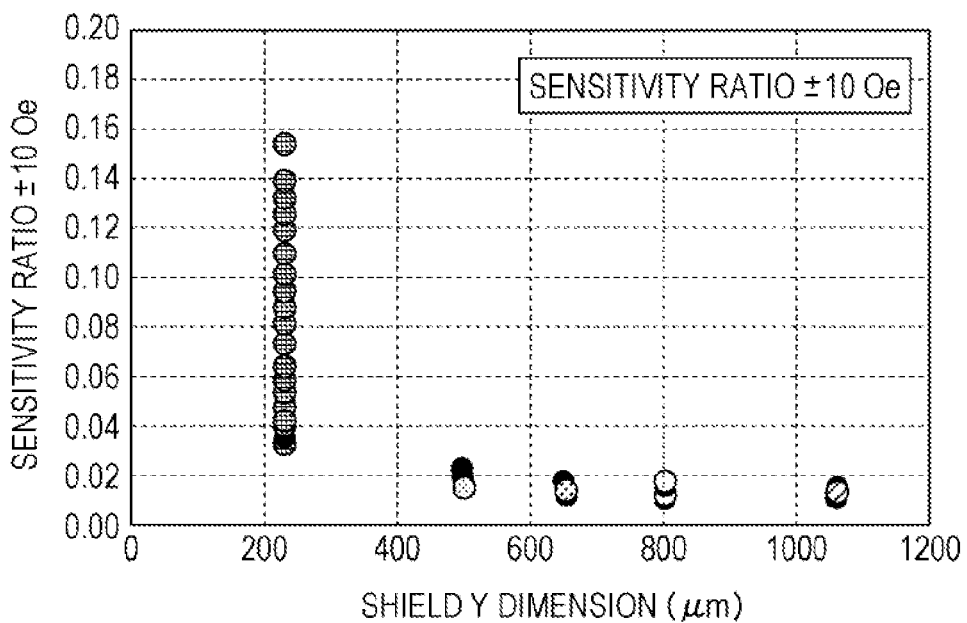

Next, a relationship between the shape of the magnetic shield and the sensitivity of the magnetoresistance effect element was studied. The results are individually illustrated in FIGS. 10A and 10B. As illustrated in FIGS. 10A and 10B, in a case in which the dimension of the magnetic shield Y is 200 µm and in a case in which the magnetic shield is divided into two portions, the reduction effect for the sensitivity varies widely. Accordingly, it is understood that, as the dimension of the magnetic shield, a sufficient dimension is necessary for fully covering the bridge of the magnetoresistance effect element. In this way, it is desirable that the dimension of the magnetic shield for obtaining the magnetic field reduction effect for the current to be measured in the current sensor is greater than the bridge circuit of the magnetoresistance effect element and from 400 µm to 1000 µm.

A magnetic balance type current sensor including the above-mentioned configuration uses a magnetoresistance effect element as a magnetic detecting element, and, in particular, uses a magnetic field detection bridge circuit including a GMR element or a TMR element. Accordingly, it may be possible to realize a high-sensitive magnetic balance type current sensor. In addition, according to such a configuration as described above, since, with causing the TCR (Temperature Coefficient Resistivity) of the magnetoresistance effect element and the TCR of the fixed resistance element to coincide with each other, it may be possible to reduce the temperature-dependent property of an output by utilizing a GMR element or a TMR element where the temperature change of a resistance change rate is small, it may be possible to improve a temperature characteristic. In addition, since, in the magnetic balance type current sensor including the above-mentioned configuration, the feedback coil 121, the magnetic shield 30, and the magnetic field detection bridge circuit are formed on the same substrate, it may be possible to achieve downsizing. Furthermore, since the magnetic balance type current sensor has the configuration in which no magnetic core is included, it may be possible to achieve downsizing and reduce a cost.

Next, an embodiment performed so as to clarify the advantageous effect of the magnetic balance type current sensor including the above-mentioned configuration will be described.

Figure 11A:
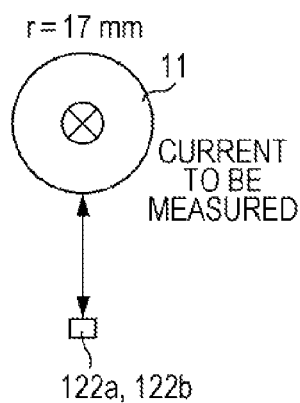
FIG. 11A is a diagram illustrating a relationship between a conductor and a magnetoresistance effect element, used for studying a relationship between a current to be measured and an induction magnetic field.
Figure 11B:
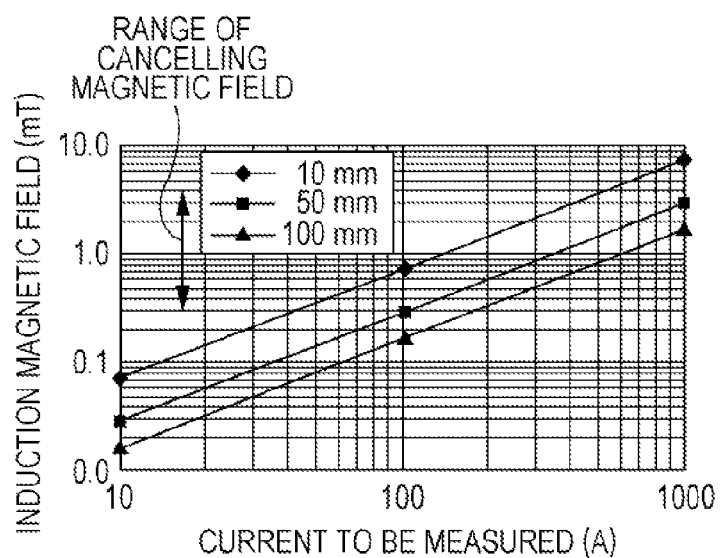
FIG. 11B is a diagram illustrating a relationship between the current to be measured and the induction magnetic field.

FIG. 11A is a diagram illustrating a relationship between a conductor and a magnetoresistance effect element, used for studying a relationship between a current to be measured and an induction magnetic field, and FIG. 11B is a diagram illustrating a relationship between the current to be measured and the induction magnetic field. The measurement of the induction magnetic field was performed with changing the current to be measured from 10 A to 1000 A with respect to each of 10 mm, 50 mm, and 100 mm to which a distance between the conductor 11 (outer periphery) with a radius of 17 mm and the magnetoresistance effect elements 122a and 122b is set. The result is illustrated in FIG. 11B.

As can be seen from FIG. 11B, in a specific range of the cancelling magnetic field, the width of the intensity of the current to be measured becomes wide with a decrease in the distance between the conductor and the magnetoresistance effect elements. In addition, when the distance between the conductor and the magnetoresistance effect elements is from 10 mm to 100 mm, the induction magnetic field varies linearly with respect to the intensity of the current to be measured and it may be possible to perform measurement with a high degree of accuracy.

Figure 12A:
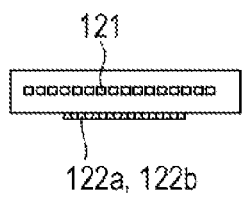
FIG. 12A is a diagram illustrating a relationship between a feedback coil and a magnetoresistance effect element, used for studying a relationship between a feedback current and a cancelling magnetic field.
Figure 12B:
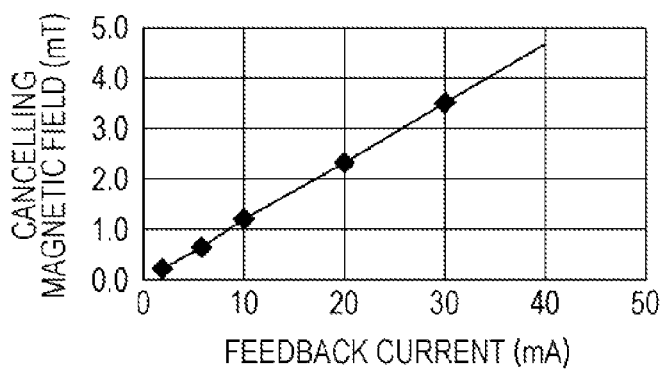
FIG. 12B is a diagram illustrating a relationship between the feedback current and the cancelling magnetic field.

In addition, FIG. 12A is a diagram illustrating a relationship between the feedback coil 121 and the magnetoresistance effect elements 122a and 122b, used for studying a relationship between the feedback current and the cancelling magnetic field, and FIG. 12B is a diagram illustrating a relationship between the feedback current and the cancelling magnetic field. While the distance between the feedback coil 121 of 16 turns and the magnetoresistance effect elements 122a and 122b was 5 μm and the feedback current was changed from 1 mA to 40 mA, the measurement of the cancelling magnetic field was performed. The result is illustrated in FIG. 12B.

As can be seen from FIG. 12B, in a range in which the intensity of the feedback current is from 1 mA to 40 mA, the cancelling magnetic field varies with respect to the intensity of the feedback current. It is understood from FIG. 11B and FIG. 12B that, in a range in which the distance between the conductor and the magnetoresistance effect elements is from 10 mm to 100 mm, it may be possible to cancel the induction magnetic field occurring from the large current (several tens of amperes to 1000 A) using the cancelling magnetic field owing to the feedback current of a low current (several milliamperes to several tens of milliamperes). Accordingly, on the basis of the magnetic balance type current sensor according to a preferred embodiment of the present invention, it may be possible to realize the current sensor with high sensitivity and low power consumption.

Figure 13A:
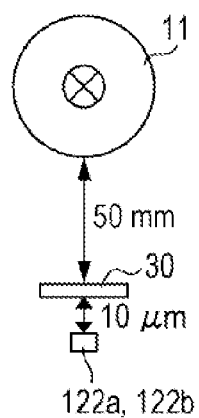
FIG. 13A is a diagram illustrating a relationship between a conductor, a magnetic shield, and a magnetoresistance effect element.
Figure 13B:
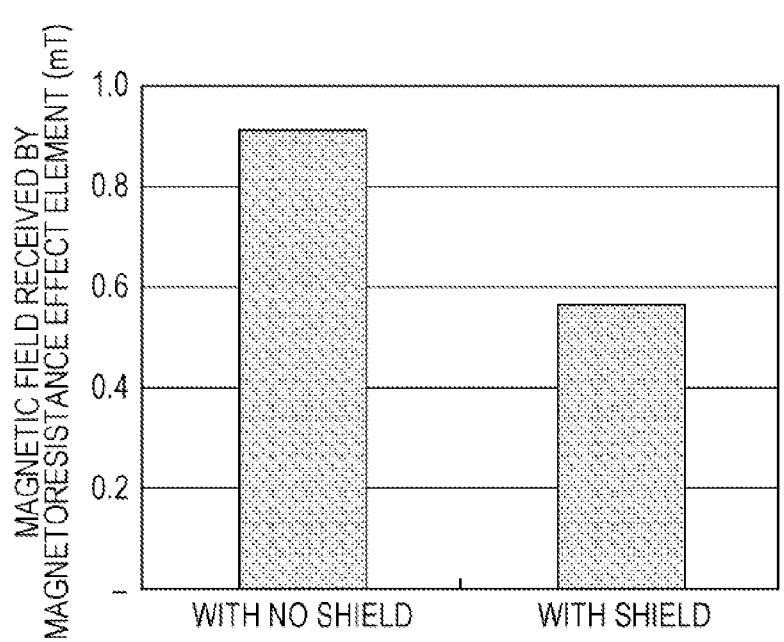
FIG. 13B is a diagram illustrating an influence of an induction magnetic field on a magnetoresistance effect element, due to the presence or absence of the magnetic shield.

In addition, FIG. 13A is a diagram illustrating a relationship between the conductor 11, the magnetic shield 30, and the magnetoresistance effect elements 122a and 122b, and FIG. 13B is a diagram illustrating the influence of the induction magnetic field on the magnetoresistance effect elements, due to the presence or absence of the magnetic shield. While the current to be measured was 300 A, a distance between the conductor 11 (outer periphery) and the magnetic shield 30 was 50 mm, and a distance from the magnetic shield 30 to the magnetoresistance effect elements 122a and 122b was 10 μm, the measurement of the induction magnetic field received by the magnetoresistance effect elements was performed. The result is illustrated in FIG. 13B. For comparison, in a configuration in which the magnetic shield is not disposed in FIG. 13A, the induction magnetic field received by the magnetoresistance effect elements was measured. The result is illustrated in FIG. 13B side by side.

As can be seen from FIG. 13B, in a configuration in which the magnetic shield is provided in such a way as the magnetic balance type current sensor according to a preferred embodiment of the present invention, the induction magnetic field received by the magnetoresistance effect elements is small, and it may be possible to achieve a magnetic equilibrium state with a smaller cancelling magnetic field. Therefore, it may be possible to reduce the feedback current and it may be possible to achieve electric power saving.

(Second Embodiment)

In the present embodiment, the case of a magnetic balance type current sensor will be described that includes a function in which a hysteresis is corrected when an output is measured in a state in which no current measurement is performed and the output is different from a reference output.

Figure 14A:
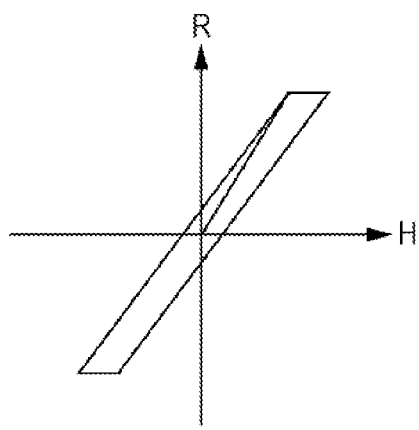
FIG. 14A is a diagram illustrating a hysteresis characteristic of a magnetoresistance effect element.
Figure 14B:
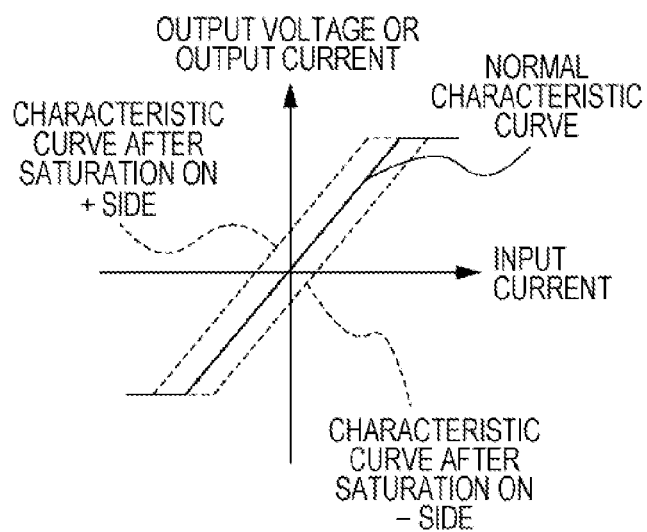
FIG. 14B is a diagram illustrating a characteristic curve of an output with respect to an input current.

In the magnetic balance type current sensor, when a current to be measured exceeding the measurement range of a sensor flows, it is difficult to achieve a magnetic equilibrium. In particular, in a case in which the magnetic detecting element is a magnetoresistance effect element, since, as illustrated in FIG. 14A, the element has a hysteresis characteristic, when the current to be measured is large, the magnetoresistance effect element is saturated and a zero point deviates owing to the hysteresis of the element. As a result, as illustrated in FIG. 14B, the characteristic curve of an output with respect to an input current deviates to a + side or a − side, and it may be considered that an error occurs in the measurement value of the sensor.

Figure 15A:
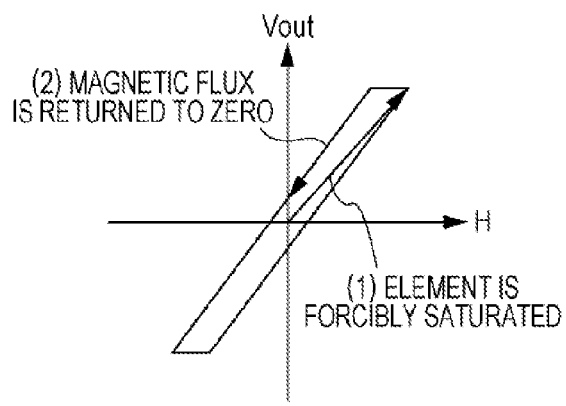
FIGS. 15A and 15B are diagrams for explaining an initialization process in a second embodiment.
Figure 15B:
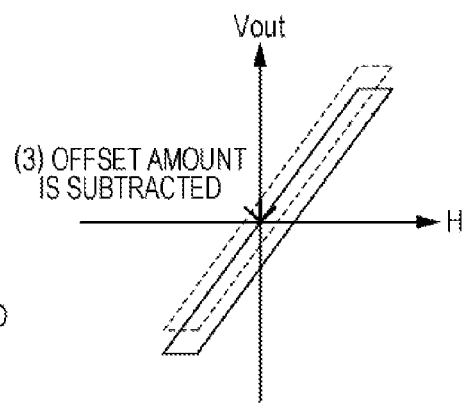

Therefore, in the present embodiment, an initialization process is performed before the current measurement. As illustrated in FIGS. 15A and 15B, in this initialization process, the magnetic flux of + or − is applied to the current sensor to forcibly saturate the element, the applied magnetic flux is returned to zero, and after that, the offset amount of the output due to the application of the magnetic flux is subtracted. Accordingly, as illustrated in FIG. 15B, it may become possible to only use one side of the hysteresis, and even if the element has a hysteresis characteristic, it may be possible to obtain the normal characteristic curve of the output with respect to the input current, illustrated in FIG. 14B. In addition, when, during the current measurement, the current to be measured exceeding the measurement range of the sensor flows and the sensor is saturated, a magnetic flux equal to the magnetic flux applied at the time of the initialization process is applied to the current sensor to saturate the element, again.

It is further desirable that the offset amount of the output, included in the sensor, is recorded when the current to be measured is zero, and it may be possible to minimize an error due to the hysteresis by subtracting the offset amount from the measurement result.

Figure 16:
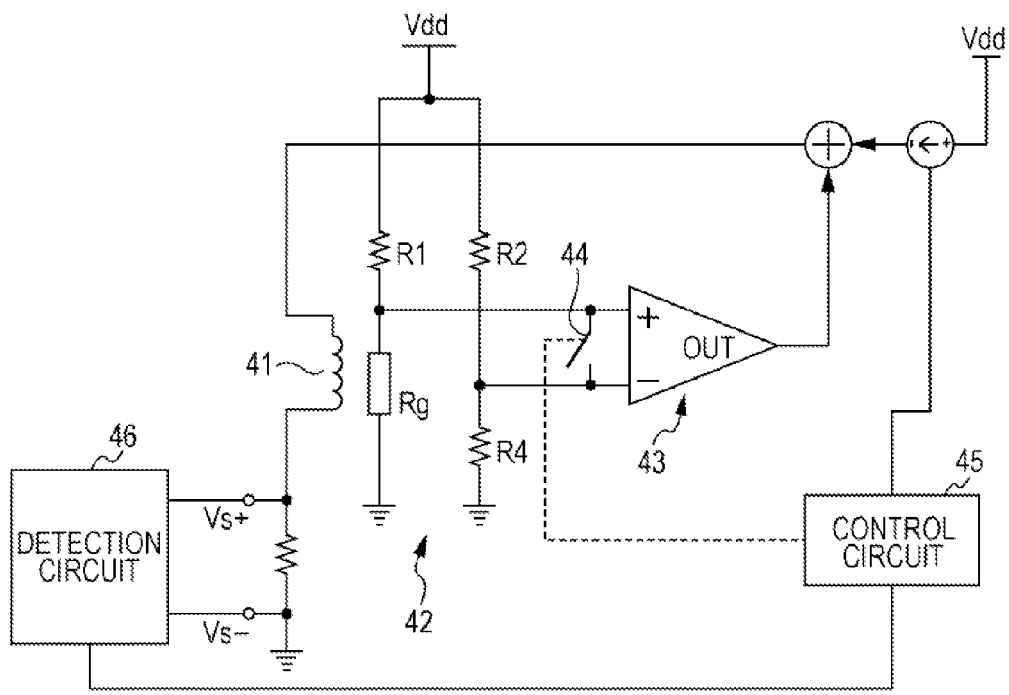
FIG. 16 is a circuit diagram illustrating a magnetic balance type current sensor with an initialization function according to the second embodiment.

FIG. 16 is a circuit diagram illustrating the magnetic balance type current sensor with an initialization function according to the present embodiment. The magnetic balance type current sensor illustrated in FIG. 16 includes a switch 44 that short-circuits the input of an amplifier (operational amplifier) 43 amplifying the output of the magnetic field detection bridge circuit 42 and a control circuit 45 that controls the initialization process, namely, the switching of the switch 44, the application of the initialization current, and processing for subtracting the offset amount of the output. In addition, a reference symbol 41 in the drawing indicates the feedback coil, and a reference symbol 46 indicates a detection circuit.

FIG. 17 is a flow diagram for explaining the initialization process according to the present embodiment. In the initialization process, first, the control circuit 45 causes the switch 44 to be switched, and the input of the operational amplifier 43 is short-circuited (ST1). Next, owing to the control circuit 45, the initialization current is applied to the feedback coil 41 and a magnetic flux is applied. Accordingly, the magnetoresistance effect element in the magnetic field detection bridge circuit 42 is forcibly saturated (ST2). Next, the control circuit 45 causes the switch 44 to be switched to restore the input of the operational amplifier 43, and the applied magnetic flux is caused to become zero (ST3). Next, owing to the control circuit 45, the offset amount of the output due to the application of the magnetic flux is subtracted (offset output Null operation) (ST4). In this way, the initialization process is completed. After that, the current to be measured flowing through the conductor is measured. In addition, the measurement of the current to be measured flowing through the conductor is the same as the first embodiment.

In this way, in the magnetic balance type current sensor of the present embodiment, since the initialization process is performed before the current measurement, it may be possible to only use one side of the hysteresis, and even if the element has a hysteresis characteristic, it may be possible to perform the current measurement in a state in which no measurement error exists.

(Third Embodiment)

In the present embodiment, a magnetic balance type current sensor will be described that includes a function in which the self-test of the magnetoresistance effect element is performed by passing a current through a calibration coil in a state in which no input of a current exists.

When the induction magnetic field occurring from the current to be measured is measured using a magnetic balance type sensor, it is likely that the magnetoresistance effect element is influenced by an external magnetic field owing to another element or a wiring line in addition to the conductor through which the current to be measured flows. In addition, when high reliability is necessary as in automobiles, it may be likely that a serious accident is invited if the output of the magnetoresistance effect element with respect to the input current changes owing to some factor.

FIG. 18 is a diagram illustrating part of the magnetic balance type current sensor according to the present embodiment. The magnetic balance type current sensor illustrated in FIG. 18 includes a feedback coil 51 and a calibration coil 52. The feedback coil 51 and the calibration coil 52 are individually disposed with the magnetoresistance effect element 53 being equidistant therefrom. Namely, a distance D1 between the feedback coil 51 illustrated in FIG. 18 and the magnetoresistance effect element 53 and a distance D2 between the calibration coil 52 and the magnetoresistance effect element 53 are equal to each other (the feedback coil 51 and the calibration coil 52 are symmetrically disposed with the magnetoresistance effect element 53 as the center thereof).

Figure 19:
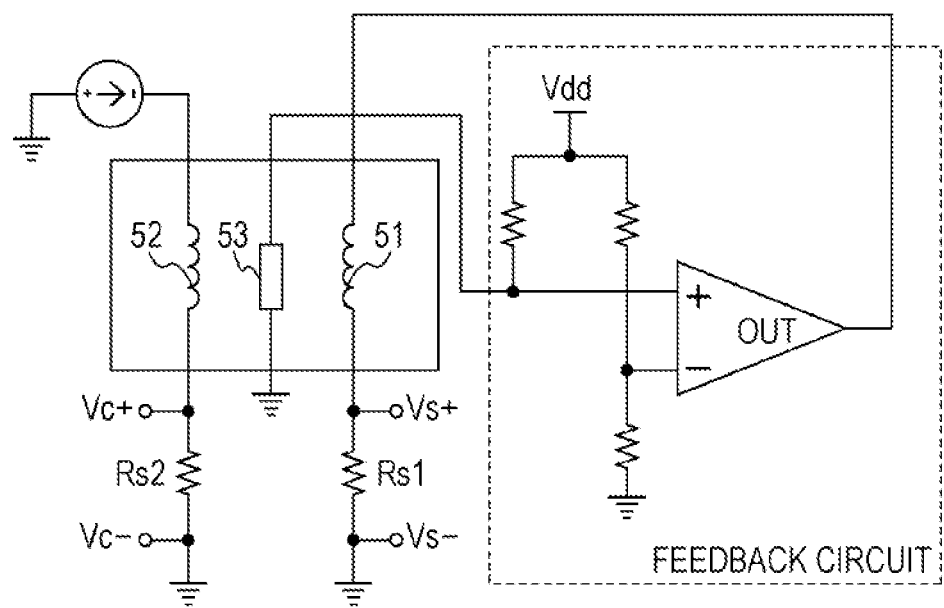
FIG. 19 is a circuit diagram illustrating the magnetic balance type current sensor according to the third embodiment.

In this way, if the magnetoresistance effect element 53 is equidistant from the coils 51 and 52, and the feedback coil 51, the calibration coil 52, and the magnetoresistance effect element 53 are made with high symmetry, when a current is passed through the calibration coil 52 in a circuit illustrated in FIG. 19, a magnetic field applied to the magnetoresistance effect element 53 is cancelled, and hence the same current as the current flowing through the calibration coil 52 also flows through the feedback coil 51. At this time, since the resistance values of current detection resistors Rs1 and Rs2 are equal to each other on a calibration coil 52 side and a feedback coil 51 side, voltages occurring in the detection resistors are also equal to each other on the calibration coil 52 side and the feedback coil 51 side. By comparing a voltage Vs on the feedback coil side with a voltage Vc on the calibration coil 52 side, it may become possible to perform the self-test of the magnetoresistance effect element.

In the magnetic balance type current sensor having such a configuration as described above, a magnetic field is generated by applying a current to the calibration coil 52 in a state in which no input of a current exists, and the resistance change of the magnetoresistance effect element 53 due to the magnetic field is measured, thereby performing the self-test of the magnetoresistance effect element 53. Accordingly, it may be possible to confirm the operational state of the magnetoresistance effect element 53, and it may be possible to confirm whether or not the characteristic of the magnetoresistance effect element 53 changes or to correct an element output. In addition, in the magnetic balance type current sensor, it is desirable that the feedback coil 51, the calibration coil 52, and the magnetoresistance effect element 53 are provided on one substrate.

Figure 20:
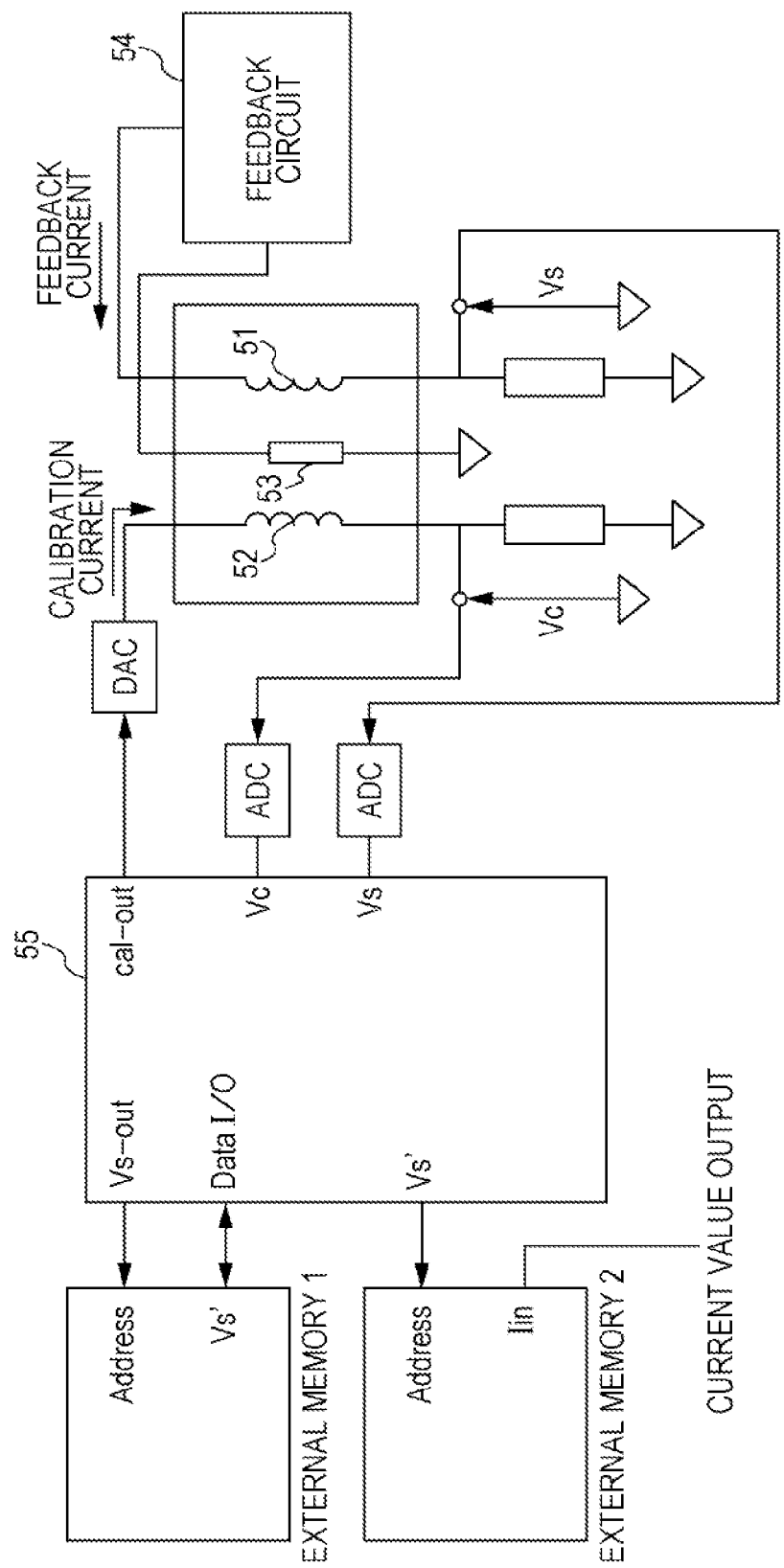
FIG. 20 is a diagram illustrating the magnetic balance type current sensor according to the third embodiment.

FIG. 20 is a diagram illustrating the magnetic balance type current sensor according to the present embodiment, which utilizes a microcomputer and an external memory. A circuit illustrated in FIG. 20 includes a microcomputer obtaining a current value on the basis of the output value of the magnetic balance type current sensor, a relationship between the voltage Vs on the feedback coil side and the voltage Vc on the calibration coil 52 side, and a relationship between the voltage Vs on the feedback coil side and the current value Iin of the current to be measured, an external memory 1 storing therein the table of the relationship between the voltage Vs on the feedback coil side and the voltage Vc on the calibration coil 52 side, and an external memory 2 storing therein the table of the relationship between the voltage Vs on the feedback coil side and the current value Iin of the current to be measured. In the magnetic balance type current sensor, the output value (the voltage of the detection resistor) of the sensor is AD-converted to be read by the microcomputer 55, and the current value of the current to be measured, which is to be a source, is obtained using the two tables stored in the external memories.

Figure 21:
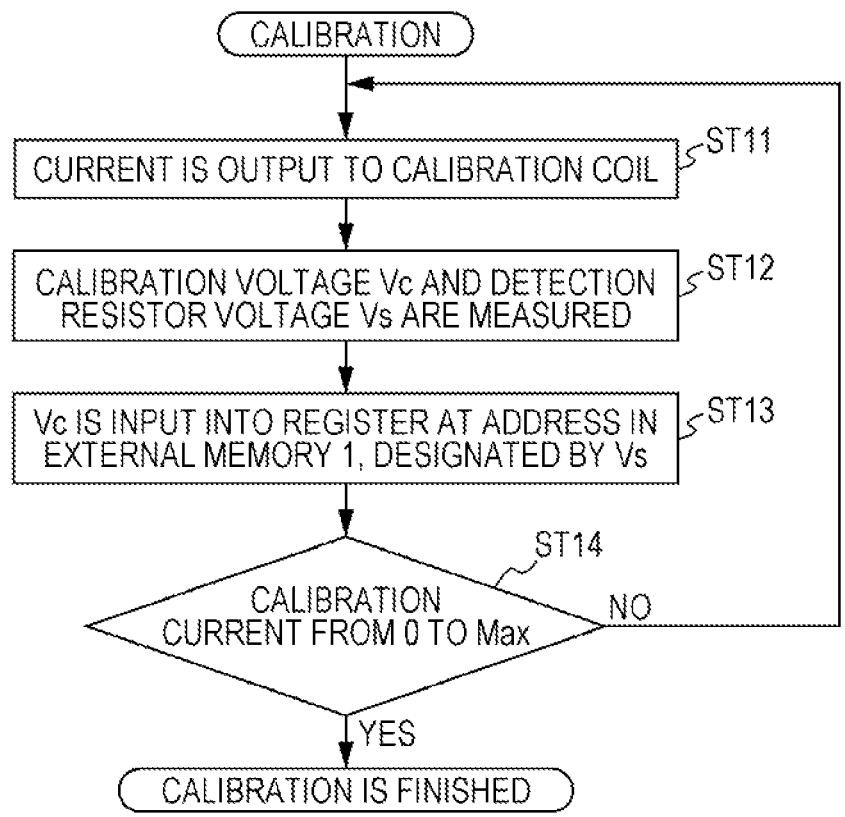
FIG. 21 is a flow diagram for explaining a self-test in the third embodiment.
Figure 22:
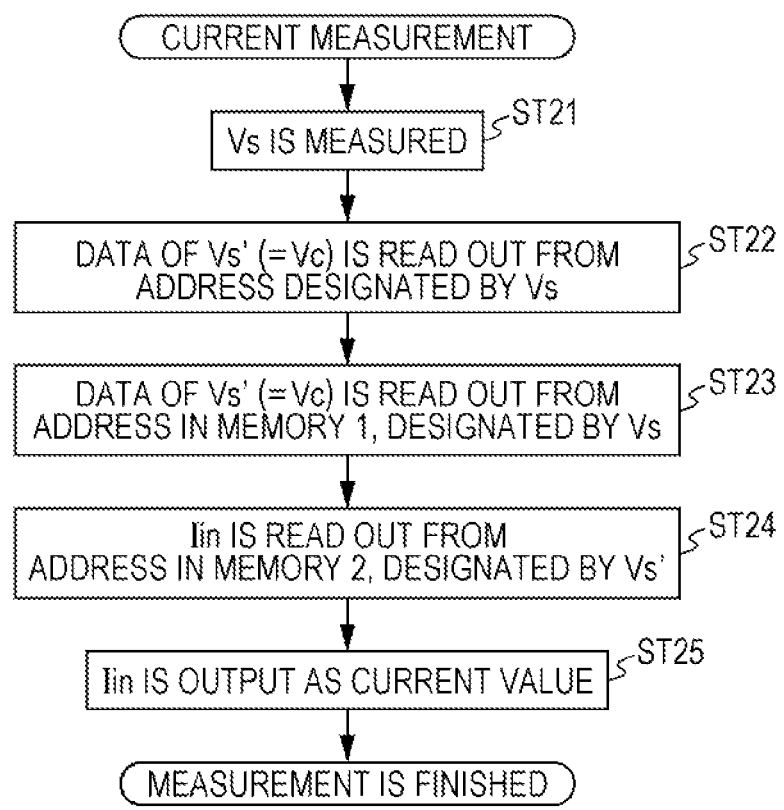
FIG. 22 is a flow diagram for explaining current measurement in the third embodiment.
Figure 23:
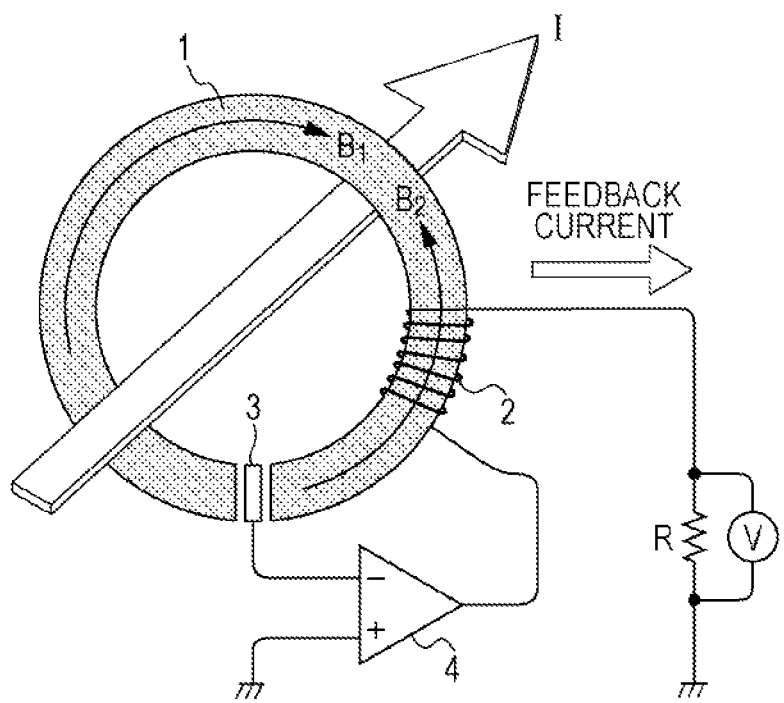
FIG. 23 is a diagram illustrating a magnetic balance type current sensor of the related art.

Using FIG. 21 and FIG. 22, a case will be described in which the self-test and the current measurement are performed using such a magnetic balance type current sensor as described above. FIG. 21 is a flow diagram for explaining the self-test in the present embodiment, and FIG. 22 is a flow diagram for explaining the current measurement in the present embodiment.

First, at the time of calibration, a current is passed through the calibration coil 52 (ST11), and the calibration voltage Vc and the detection resistor voltage Vs are measured through an AD converter (ST12). Next, the numerical value of the calibration voltage Vc is stored as Vs' in an address in the external memory 1, designated by the detection resistor voltage Vs (ST13). Next, by repeatedly performing this with the current being changed to the maximum value of the feedback current, the table relating to the detection resistor voltage Vs and the calibration voltage Vc is created (ST14). Using this table, it may be possible to calibrate the detection resistor voltage Vs of the magnetic balance type current sensor.

At the time of measurement, the detection resistor voltage Vs due to the current detection resistor Rs1 is read through the AD converter (ST21), the correction table stored in the external memory 1 on the basis of the detection resistor voltage Vs is referenced, and a numerical value Vs' (=Vc) subjected to correction is read (ST22, ST23). Next, by referencing the table used for obtaining the current to be measured from the feedback current, the Iin stored in the external memory 2 is read out on the basis of the numerical value Vs' subjected to correction (ST24), and the numerical value read out is regarded as the current value output of the sensor (ST25).

In this way, in the magnetic balance type current sensor of the present embodiment, since it may be possible to calibrate the magnetoresistance effect element, even if the output of magnetoresistance effect element with respect to the input current changes owing to the influence of the external magnetic field or some factor, it may be possible to perform the current measurement in a state in which no measurement error exists.

The present invention is not limited to the above-mentioned first to third embodiments, and may be implemented with various modifications. For example, the present invention may be implemented with materials, connection relationships between individual elements, thicknesses, sizes, and manufacturing processes in the above-mentioned first to third embodiments being arbitrarily changed. Furthermore, the present invention may be implemented with modifications being arbitrarily made without departing from the scope of the invention The present invention is applicable to a current sensor detecting the intensity of a current used for driving a motor in an electric automobile.

What is claimed is:

1. A magnetic balance type current sensor comprising:
    a magnetic field detection bridge circuit, including:
        a magnetoresistance effect element having a resistance value which changes depending on an induction magnetic field applied thereto from a current to be measured; and
        an output configured to generate a voltage difference in accordance with the induction magnetic field;
    a feedback coil disposed in a vicinity of the magnetoresistance effect element, configured to receive a feedback current corresponding to the voltage difference, and generate, in accordance with the feedback current, a cancelling magnetic field for cancelling out the induction magnetic field;
    a magnetic shield configured to attenuate the induction magnetic field and to enhance the cancelling magnetic field;
    a current detection unit configured to measure the current to be measured on the basis of the feedback current flowing through the feedback coil in an equilibrium state in which the induction magnetic field and the cancelling magnetic field are cancelled out each other,
    wherein the feedback coil, the magnetic shield, and the magnetic field detection bridge circuit are formed on a same substrate, and wherein the feedback coil is disposed between the magnetic shield and the magnetic field detection bridge circuit, and the magnetic shield is disposed between the current to be measured and the feedback coil.

2. The magnetic balance type current sensor according to claim 1, wherein
    the magnetoresistance effect element is a spin-valve-type GMR element or a spin-valve-type TMR element.

3. The magnetic balance type current sensor according to claim 2, wherein the GMR element has a meander shape having a width ranging from 1 μm to 10 μm, and a length in a longitudinal direction greater than or equal to twice the width,
    and wherein the GMR element is disposed so that the longitudinal direction is perpendicular to both a direction of the induction magnetic field and a direction of the cancelling magnetic field.

4. The magnetic balance type current sensor according to claim 2, wherein the TMR element has a rectangle shape having a width ranging from 1 μm to 10 μm, and a length in a longitudinal direction greater than or equal to twice the width,
    and wherein the TMR element is disposed so that the longitudinal direction is perpendicular to both a direction of the induction magnetic field and a direction of the cancelling magnetic field.

5. The magnetic balance type current sensor according to claim 1, wherein the feedback coil is formed of a planar coil, the planar coil being disposed such that the cancelling magnet field is substantially parallel to the induction magnetic field in a plane parallel to a planar surface of the planar coil.

6. The magnetic balance type current sensor according to claim 1, wherein the magnetic shield is formed of a high magnetic permeability material selected from among the group consigning of amorphous magnetic material, permalloy-based magnetic material, and iron-based microcrystalline material.

7. The magnetic balance type current sensor according to claim 1, wherein a distance between the magnetoresistance effect element and the magnetic shield is 2 μm to 20 μm.

8. The magnetic balance type current sensor according to claim 1, wherein a thickness of the magnetic shield is 2 μm to 20 μm.

9. The magnetic balance type current sensor according to claim 1, wherein a dimension of the magnetic shield is 400 μm to 1000 μm.

10. The magnetic balance type current sensor according to claim 1, wherein the feedback coil does not include a magnetic core associated therewith.

11. The magnetic balance type current sensor according to claim 1, wherein a width of the magnetic shield in a direction of the magnetic field is greater than a width of the feedback coil.

12. The magnetic balance type current sensor according to claim 11, wherein the width of the feedback coil is greater than a width of the magnetoresistance effect elements.

13. The magnetic balance type current sensor according to claim 1, wherein the feedback coil includes:
    a first part configured to be aligned with the current to be measured; and
    a second part configured to be off the current to be measured, and wherein the magnetic field detection bridge circuit includes:
    a pair of magnetoresistance effect elements provided beneath the first part of the feedback coil; and
    a pair of fixed resistance elements provided beneath the second part of the feedback coil.

14. A magnetic balance type current sensor comprising:
    a magnetic field detection bridge circuit, including:
        a magnetoresistance effect element having a resistance value which changes depending on an induction magnetic field applied thereto from a current to be measured; and
        an output configured to generate a voltage difference in accordance with the induction magnetic field;
    a feedback coil disposed in a vicinity of the magnetoresistance effect element, configured to receive a feedback current corresponding to the voltage difference, and generate, in accordance with the feedback current, a cancelling magnetic field for cancelling out the induction magnetic field;
    a magnetic shield configured to attenuate the induction magnetic field and to enhance the cancelling magnetic field; and
    a current detection unit configured to measure the current to be measured on the basis of the feedback current flowing through the feedback coil in an equilibrium state in which the induction magnetic field and the cancelling magnetic field are cancelled out each other,
    wherein the feedback coil, the magnetic shield, and the magnetic field detection bridge circuit are formed on a same substrate,
    wherein the magnetoresistance effect element is a spin-valve-type GMR element, wherein the GMR element has a meander shape having a width ranging from 1 µm to 10 µm, and a length in a longitudinal direction greater than or equal to twice the width, and wherein the GMR element is disposed so that the longitudinal direction is perpendicular to both a direction of the induction magnetic field and a direction of the cancelling magnetic field.

15. A magnetic balance type current sensor comprising:

a magnetic field detection bridge circuit, including:

a magnetoresistance effect element having a resistance value which changes depending on an induction magnetic field applied thereto from a current to be measured; and an output configured to generate a voltage difference in accordance with the induction magnetic field;

a feedback coil disposed in a vicinity of the magnetoresistance effect element, configured to receive a feedback current corresponding to the voltage difference, and generate, in accordance with the feedback current, a cancelling magnetic field for cancelling out the induction magnetic field;

a magnetic shield configured to attenuate the induction magnetic field and to enhance the cancelling magnetic field; and a current detection unit configured to measure the current to be measured on the basis of the feedback current flowing through the feedback coil in an equilibrium state in which the induction magnetic field and the cancelling magnetic field are cancelled out each other, wherein the feedback coil, the magnetic shield, and the magnetic field detection bridge circuit are formed on a same substrate, wherein the magnetoresistance effect element is a spin-valve-type TMR element, wherein the TMR element has a rectangle shape having a width ranging from 1 µm to 10 µm, and a length in a longitudinal direction greater than or equal to twice the width, and wherein the TMR element is disposed so that the longitudinal direction is perpendicular to both a direction of the induction magnetic field and a direction of the cancelling magnetic field.

16. A magnetic balance type current sensor comprising:

a magnetic field detection bridge circuit, including:

a magnetoresistance effect element having a resistance value which changes depending on an induction magnetic field applied thereto from a current to be measured; and an output configured to generate a voltage difference in accordance with the induction magnetic field;

a feedback coil disposed in a vicinity of the magnetoresistance effect element, configured to receive a feedback current corresponding to the voltage difference, and generate, in accordance with the feedback current, a cancelling magnetic field for cancelling out the induction magnetic field;

a magnetic shield configured to attenuate the induction magnetic field and to enhance the cancelling magnetic field; and a current detection unit configured to measure the current to be measured on the basis of the feedback current flowing through the feedback coil in an equilibrium state in which the induction magnetic field and the cancelling magnetic field are cancelled out each other, wherein the feedback coil, the magnetic shield, and the magnetic field detection bridge circuit are formed on a same substrate, and wherein the feedback coil is formed of a planar coil, the planar coil being disposed such that the cancelling magnet field is substantially parallel to the induction magnetic field in a plane parallel to a planar surface of the planar coil.

* * * * *